United States Patent
Ten Berge et al.

(10) Patent No.: US 10,719,011 B2
(45) Date of Patent: Jul. 21, 2020

(54) METHOD AND APPARATUS TO CORRECT FOR PATTERNING PROCESS ERROR

(71) Applicant: ASML NETHERLANDS B.V., Veldhoven (NL)

(72) Inventors: Peter Ten Berge, Eindhoven (NL); Daan Maurits Slotboom, Wolphaartsdijk (NL); Richard Johannes Franciscus Van Haren, Waalre (NL); Peter Hanzen Wardenier, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 239 days.

(21) Appl. No.: 15/765,489

(22) PCT Filed: Sep. 27, 2016

(86) PCT No.: PCT/EP2016/072960
§ 371 (c)(1),
(2) Date: Apr. 2, 2018

(87) PCT Pub. No.: WO2017/067757
PCT Pub. Date: Apr. 27, 2017

(65) Prior Publication Data
US 2018/0252998 A1    Sep. 6, 2018

Related U.S. Application Data

(60) Provisional application No. 62/243,593, filed on Oct. 19, 2015.

(51) Int. Cl.
*G03F 1/72* (2012.01)
*G03F 1/84* (2012.01)

(52) U.S. Cl.
CPC . *G03F 1/72* (2013.01); *G03F 1/84* (2013.01)

(58) Field of Classification Search
CPC .................................. G03F 1/72; G03F 1/84
USPC ....................................................... 430/5, 30
See application file for complete search history.

(56) References Cited

U.S. PATENT DOCUMENTS

| | | | |
|---|---|---|---|
| 7,136,144 B2 | 11/2006 | Smith et al. |
| 7,349,753 B2 | 3/2008 | Paik |
| 7,362,415 B2 | 4/2008 | Franken et al. |
| 7,369,697 B2 | 5/2008 | Starikov |
| 7,381,503 B2 | 6/2008 | Smith et al. |
| 7,710,539 B2 | 5/2010 | Menchtchikov et al. |
| 7,791,732 B2 | 9/2010 | Den Boef et al. |
| 8,856,694 B2 | 10/2014 | Ye et al. |
| 8,893,060 B2 | 11/2014 | Feng et al. |
| 8,898,599 B2 | 11/2014 | Liu et al. |
| 9,052,709 B2 | 6/2015 | Cohen et al. |
| 9,213,783 B2 | 12/2015 | Hansen |
| 9,417,533 B2 | 8/2016 | Prosyentsov et al. |
| 9,588,438 B2 | 3/2017 | Hsu et al. |
| 9,709,903 B2 | 7/2017 | Choi et al. |
| 2002/0026626 A1 | 2/2002 | Randall et al. |
| 2002/0102482 A1 | 8/2002 | Smith et al. |
| 2003/0054642 A1 | 3/2003 | Kagotani et al. |
| 2004/0038139 A1 | 2/2004 | Mui et al. |
| 2005/0084767 A1 | 4/2005 | Zait et al. |
| 2006/0008715 A1 | 1/2006 | Chen et al. |
| 2006/0066855 A1 | 3/2006 | Den Boef et al. |
| 2006/0089740 A1 | 4/2006 | Poolla et al. |
| 2006/0114436 A1 | 6/2006 | Oesterholt et al. |
| 2006/0119815 A1 | 6/2006 | Franken et al. |
| 2006/0234139 A1 | 10/2006 | Watson et al. |
| 2007/0050749 A1 | 3/2007 | Ye et al. |
| 2007/0061773 A1 | 3/2007 | Ye et al. |
| 2007/0065732 A1 | 3/2007 | Lee et al. |
| 2008/0032206 A1 | 2/2008 | Lee et al. |
| 2008/0145793 A1 | 6/2008 | Patel et al. |
| 2008/0170774 A1 | 7/2008 | Xiong et al. |
| 2008/0286667 A1 | 11/2008 | Okita |
| 2009/0307649 A1 | 12/2009 | Pramanik et al. |

(Continued)

FOREIGN PATENT DOCUMENTS

| | | |
|---|---|---|
| CN | 101122737 | 2/2008 |
| EP | 1775635 | 4/2007 |
| JP | 2006157014 | 6/2006 |
| KR | 20130095262 | 8/2013 |
| KR | 20160124850 | 10/2016 |
| TW | 200731334 | 8/2007 |

OTHER PUBLICATIONS

Office Action issued in corresponding U.S. Appl. No. 15/769,539, dated Jul. 25, 2019.

(Continued)

*Primary Examiner* — Christopher G Young
(74) *Attorney, Agent, or Firm* — Pillsbury Winthrop Shaw Pittman LLP

(57) ABSTRACT

A method including: determining first error information based on a first measurement and/or simulation result pertaining to a first patterning device in a patterning system; determining second error information based on a second measurement and/or simulation result pertaining to a second patterning device in the patterning system; determining a difference between the first error information and the second error information; and creating modification information for the first patterning device and/or the second patterning device based on the difference between the first error information and the second error information, wherein the difference between the first error information and the second error information is reduced to within a certain range after the first patterning device and/or the second patterning device is modified according to the modification information.

20 Claims, 15 Drawing Sheets

(56) References Cited

U.S. PATENT DOCUMENTS

| | | |
|---|---|---|
| 2010/0146475 A1 | 6/2010 | Cao et al. |
| 2010/0195069 A1 | 8/2010 | Fukuhara |
| 2010/0203457 A1 | 8/2010 | Hatakeyama |
| 2012/0009511 A1 | 1/2012 | Dmitriev |
| 2012/0054694 A1 | 3/2012 | Hamouda |
| 2012/0113404 A1 | 5/2012 | Hsu et al. |
| 2012/0117522 A1 | 5/2012 | Feng et al. |
| 2012/0133914 A1 | 5/2012 | Prosyentsov et al. |
| 2012/0227014 A1 | 9/2012 | Pforr |
| 2012/0303151 A1 | 11/2012 | Ye et al. |
| 2013/0017474 A1 | 1/2013 | Chiang et al. |
| 2013/0035888 A1 | 2/2013 | Kandel et al. |
| 2013/0131857 A1 | 5/2013 | Fan et al. |
| 2013/0179847 A1 | 7/2013 | Hansen |
| 2013/0326437 A1 | 12/2013 | Liu et al. |
| 2014/0038087 A1 | 2/2014 | Gallagher et al. |
| 2016/0349627 A1 | 12/2016 | Van Der Schaar et al. |

OTHER PUBLICATIONS

Office Action issued in corresponding U.S. Appl. No. 15/769,517, dated Jul. 11, 2019.

Office Action issued in corresponding U.S. Appl. No. 15/769,339, dated Jul. 10, 2019.

International Search Report and Written Opinion dated Dec. 7, 2016 in corresponding International Patent Application No. PCT/EP2016/072926.

International Search Report and Written Opinion dated Nov. 30, 2016 in corresponding International Patent Application No. PCT/EP2016/073084.

International Search Report and Written Opinion dated Jan. 5, 2017 in corresponding International Patent Application No. PCT/EP2016/072936.

International Search Report and Written Opinion dated Dec. 16, 2016 in corresponding International Patent Application No. PCT/EP2016/072873.

International Search Report and Written Opinion dated Dec. 19, 2016 in corresponding International Patent Application No. PCT/EP2016/072852.

Chinese Office Action dated Jul. 13, 2017 in corresponding Chinese Patent Application No. 105133541.

Final Office Action issued in corresponding U.S. Appl. No. 15/769,539, dated Jan. 8, 2020.

Final Office Action issued in corresponding U.S. Appl. No. 15/769,339, dated Dec. 11, 2019.

Korean Office Action issued in corresponding Korean Patent Application No. 10-2018-7014221, dated Nov. 28, 2019.

International Search Report and Written Opinion dated Jan. 20, 2017 in corresponding International Patent Application No. PCT/EP2016/072960.

Sharoni, Ofir, et al., "Intra-field on-product overlay improvement by application of RegC and TWINSCAN corrections," Proceedings of SPIE, vol. 9424, 11 pages, (Mar. 19, 2015).

Office Action issued in corresponding U.S. Appl. No. 15/769,338, dated Sep. 30, 2019.

Final Office Action issued in corresponding U.S. Appl. No. 15/769,338, dated Feb. 20, 2020.

Notice of Allowance issued in corresponding U.S. Appl. No. 15/769,539, dated Feb. 22, 2020.

Office Action issued in corresponding U.S. Appl. No. 15/769,339, dated May 14, 2020.

METHOD AND APPARATUS TO CORRECT FOR PATTERNING PROCESS ERROR

CROSS-REFERENCE TO RELATED APPLICATIONS

This application is the U.S. national phase entry of PCT patent application no. PCT/EP2016/072960, which was filed on Sep. 27, 2016, which claims priority of U.S. provisional application No. 62/243,593, which was filed on Oct. 19, 2015, and which is incorporated herein in its entirety by reference.

FIELD

The present description relates to a method and apparatus for correcting patterning process errors by, for example, modifying one or more patterning devices.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the functional of the device, including failure of the device to function or one or more electrical problems of the functioning device.

One or more apparatuses used in the patterning process may be used to correct (e.g., at least partially, if not wholly) one or more of the errors. For example, the lithographic apparatus may be able to correct a portion of the errors by adjusting one or more actuators in the lithographic apparatus. But, a remaining error may not be correctable by the one or more actuators in the lithographic apparatus. Therefore, it desirable to provide a method and/or an apparatus that can further or better correct errors in the patterning process.

In an embodiment, there is provided a method comprising: identifying that an area of a first substrate comprises a hotspot based on a measurement and/or simulation result pertaining to a patterning device in a patterning system; determining first error information at the hotspot; and creating first modification information for modifying the patterning device based on the first error information to obtain a modified patterning device.

In an embodiment, there is provided a system comprising: a hardware processor system; and a non-transitory computer readable storage medium storing machine-readable instructions, wherein when executed, the machine-readable instructions cause the processor system to: identify that an area of a first substrate comprises a hotspot based on a measurement and/or simulation result pertaining to a patterning device in a patterning system; determine first error information at the hotspot; and create first modification information for modifying the patterning device based on the first error information to obtain a modified patterning device.

In an embodiment, there is provided a method comprising: obtaining patterning error information for a patterning process involving a patterning device; and determining a patterning error offset for a modification apparatus of the patterning process based on the patterning error information and information about the modification apparatus, wherein combination of the patterning error offset and the patterning error is modifiable within a modification range of the modification apparatus.

In an embodiment, there is provided a method comprising: obtaining a measurement and/or simulation result of a pattern after being processed by an etch tool of a patterning system; determining a patterning error due to an etch loading effect based on the measurement and/or simulation result; and creating modification information for modifying a patterning device and/or for adjusting a modification apparatus upstream in the patterning system from the etch tool based on the patterning error, wherein the patterning error is converted to a correctable error and/or reduced to a certain range, when the patterning device is modified according to the modification information and/or the modification apparatus is adjusted according to the modification information.

In an embodiment, there is provided a method comprising: obtaining information regarding an error in addition to, or other than, a patterning device registration error, wherein a portion of the error is not correctable by a modification apparatus of a patterning system; and creating modification information for modifying a patterning device based on the error information, the modification information transforming the portion of the error to correctable error for the modification apparatus when the patterning device is modified according to the modification information.

In an embodiment, there is provided a system comprising: a hardware processor system; and a non-transitory computer readable storage medium storing machine-readable instructions, wherein when executed, the machine-readable instructions cause the processor system to: obtain patterning error information for a patterning process involving a patterning device; and determine a patterning error offset for a modification apparatus of the patterning process based on the patterning error information and information about the modification apparatus, wherein combination of the patterning error offset and the patterning error is modifiable within a modification range of the modification apparatus.

In an embodiment, there is provided a system comprising: a hardware processor system; a non-transitory computer readable storage medium storing machine-readable instructions, wherein when executed, the machine-readable instructions cause the processor system to: obtain a measurement and/or simulation result of a pattern after being processed by an etch tool of a patterning system; determine a patterning error due to an etch loading effect based on the measurement and/or simulation result; and create modification information for modifying a patterning device and/or for adjusting a modification apparatus upstream in the patterning system from the etch tool based on the patterning error, wherein the patterning error is converted to a correctable error and/or reduced to a certain range, when the patterning device is modified according to the modification information and/or the modification apparatus is adjusted according to the modification information.

In an embodiment, there is provided a system comprising: a hardware processor system; and a non-transitory computer readable storage medium storing machine-readable instructions, wherein when executed, the machine-readable instructions cause the processor system to: obtain information regarding an error in addition to, or other than, a patterning device registration error, wherein a portion of the error is not correctable by a modification apparatus of a patterning system; and create modification information for modifying a patterning device based on the error information, the modification information transforming the portion of the error to correctable error for the modification apparatus when the patterning device is modified according to the modification information.

In an embodiment, there is provided a method comprising: obtaining a measurement result of a pattern provided to, and/or a simulation result for the pattern to be provided to, an area of a substrate, the pattern provided, or to be provided, by using a patterning device in a patterning system; determining an error between the pattern and a target pattern; and creating modification information for the patterning device based on the error, wherein the error is converted to a correctable error and/or reduced to a certain range, when the patterning device is modified according to the modification information.

In an embodiment, there is provided a system comprising: a hardware processor system; and a non-transitory computer readable storage medium storing machine-readable instructions, wherein when executed, the machine-readable instructions cause the processor system to: obtain a measurement result of a pattern provided to, and/or a simulation result for the pattern to be provided to, an area of a substrate, the pattern provided, or to be provided, by using a patterning device in a patterning system; determine an error between the pattern and a target pattern; and create modification information for the patterning device based on the error, wherein the error is converted to a correctable error and/or reduced to a certain range, when the patterning device is modified according to the modification information.

In an embodiment, there is provided a method comprising: obtaining information describing a modification made or to be made by a pattern modification tool to a patterning device for a patterning process; obtaining a spatial distribution of temperature and/or deformation of the patterning device; and predicting cracking behavior of the patterning device based on the modification information of the patterning device and the spatial distribution of temperature and/or deformation of the patterning device.

In an embodiment, there is provided a method comprising: obtaining a spatial distribution of temperature and/or deformation of a patterning device for use in a patterning system; obtaining a prediction on cracking behavior of the patterning device based on the spatial distribution of temperature and/or deformation of the patterning device; and preventing use of the patterning device in the patterning system responsive to the prediction indicating the patterning device has cracked or is going to crack.

In an embodiment, there is provided a system comprising: a hardware processor system; and a non-transitory computer readable storage medium storing machine-readable instructions, wherein when executed, the machine-readable instructions cause the processor system to: obtain information describing a modification made or to be made by a pattern modification tool to a patterning device for a patterning process; obtain a spatial distribution of temperature and/or deformation of the patterning device; and predict cracking behavior of the patterning device based on the modification information of the patterning device and the spatial distribution of temperature and/or deformation of the patterning device.

In an embodiment, there is provided a system comprising: a hardware processor system; and a non-transitory computer readable storage medium storing machine-readable instructions, wherein when executed, the machine-readable instructions cause the processor system to: obtain a spatial distribution of temperature and/or deformation of a patterning device for use in a patterning system; obtain a prediction on cracking behavior of the patterning device based on the spatial distribution of temperature and/or deformation of the patterning device; and prevent use of the patterning device in the patterning system responsive to the prediction indicating the patterning device has cracked or is going to crack.

In an embodiment, there is provided a method comprising: determining first error information based on a first measurement and/or simulation result pertaining to a first patterning device in a patterning system; determining second error information based on a second measurement and/or simulation result pertaining to a second patterning device in the patterning system; determining a difference between the first error information and the second error information; and creating modification information for the first patterning device and/or the second patterning device based on the difference between the first error information and the second error information, wherein the difference between the first error information and the second error information is reduced to within a certain range after the first patterning device and/or the second patterning device is modified according to the modification information.

In an embodiment, there is provided a system comprising: a hardware processor system; and a non-transitory computer readable storage medium storing machine-readable instructions, wherein when executed, the machine-readable instructions cause the processor system to: determine first error information based on a first measurement and/or simulation result pertaining to a first patterning device in a patterning system; determine second error information based on a second measurement and/or simulation result pertaining to a second patterning device in the patterning system; determine a difference between the first error information and the second error information; and create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

In an embodiment, there is provided a method comprising: determining first error information based on a first measurement and/or simulation result pertaining to a first patterning device in a first patterning system; determining second error information based on a second measurement and/or simulation result pertaining to a second patterning device in a second patterning system; determining a difference between the first error information and the second error information; and creating modification information for the first patterning device and/or the second patterning device based on the difference between the first error information and the second error information, wherein the difference between the first error information and the second error information is reduced within a certain range after the first patterning device and/or the second patterning device is modified according to the modification information.

In an embodiment, there is provided a system comprising: a hardware processor system; and a non-transitory computer readable storage medium storing machine-readable instructions, wherein when executed, the machine-readable instructions cause the processor system to: determine first error information based on a first measurement and/or simulation result pertaining to a first patterning device in a first patterning system; determine second error information based on a second measurement and/or simulation result pertaining to a second patterning device in a second patterning system; determine a difference between the first error information and the second error information; and create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

In an embodiment, there is provided a method comprising: modelling, by a computer system, a high resolution patterning error information of a patterning process involving a patterning device in a patterning system using an error mathematical model; modelling, by the computer system, a correction of the patterning error that can be made by a patterning device modification tool using a correction mathematical model, the correction mathematical model having substantially the same resolution as the error mathematical model; and determining, by the computer system, modification information for modifying the patterning device using the patterning device modification tool by applying the correction mathematical model to the patterning error information modeled by the error mathematical model.

In an embodiment, there is provided a system comprising: a hardware processor system; and a non-transitory computer readable storage medium storing machine-readable instructions, wherein when executed, the machine-readable instructions cause the processor system to: model, by a computer system, a high resolution patterning error information of a patterning process involving a patterning device in a patterning system using an error mathematical model; model, by the computer system, a correction of the patterning error that can be made by a patterning device modification tool using a correction mathematical model, the correction mathematical model having substantially the same resolution as the error mathematical model; and determine, by the computer system, modification information for modifying the patterning device using the patterning device modification tool by applying the correction mathematical model to the patterning error information modeled by the error mathematical model.

In an aspect, there is provided a non-transitory computer program product comprising machine-readable instructions for causing a processor system to cause performance of a method described herein.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
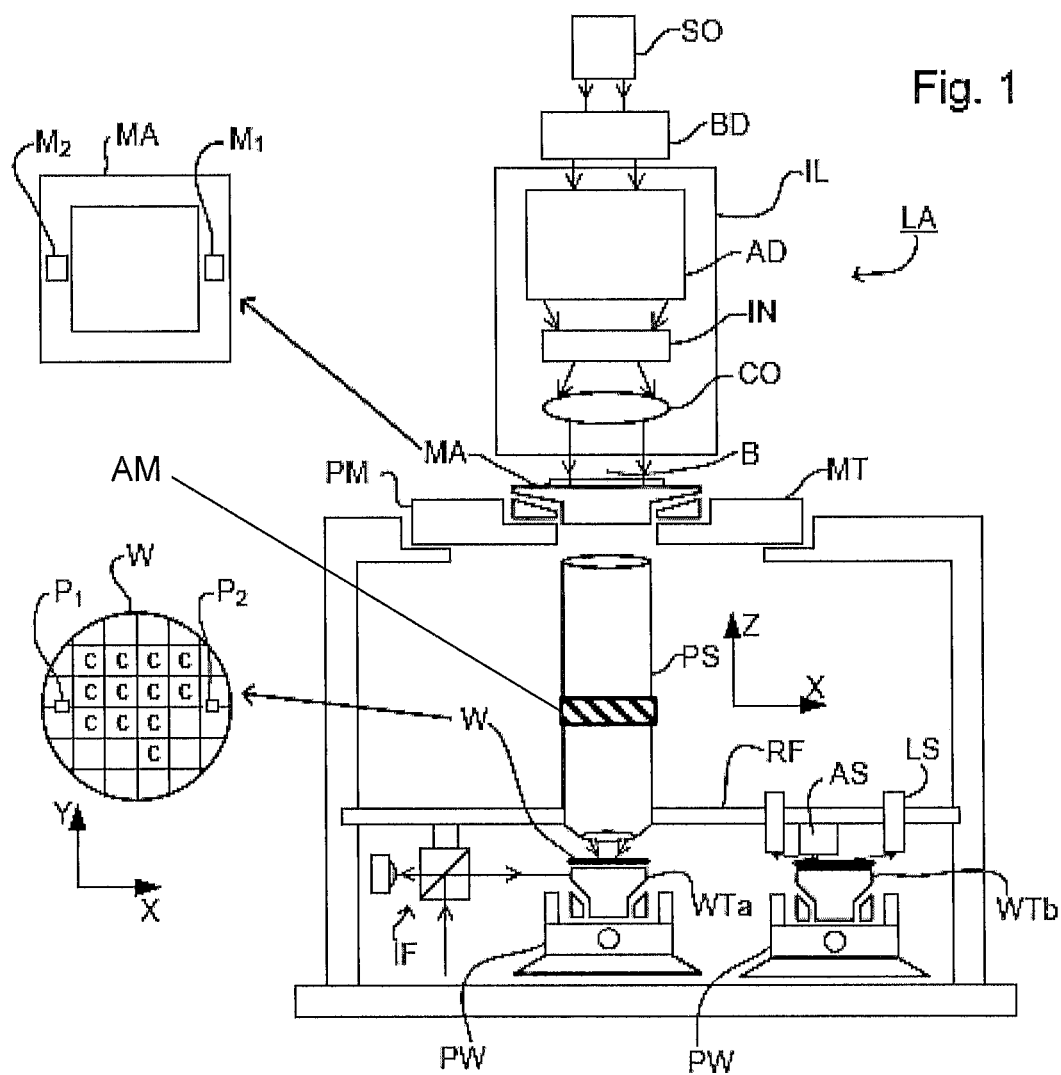
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
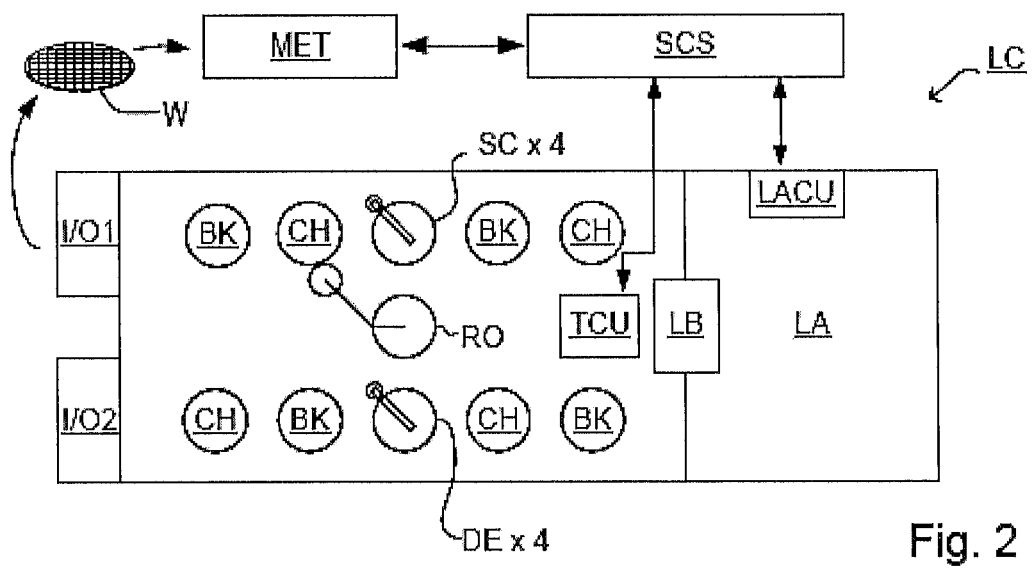
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure one or more properties such as overlay error between subsequent layers, line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithocell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

In order to monitor the patterning process (e.g., a device manufacturing process) that includes at least one patterning step (e.g., an optical lithography step), the patterned substrate is inspected and one or more parameters of the patterned substrate are measured. The one or more parameters may include, for example, overlay error between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. There are various techniques for making measurements of the structures formed in the patterning process, including the use of a scanning electron microscope, image-based measurement or inspection tools and/or various specialized tools. A fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection. A particular application of this diffraction-based metrology or inspection is in the measurement of feature asymmetry within a periodic target. This can be used as a measure of overlay error, for example, but other applications are also known. For example, asymmetry can be measured by comparing opposite parts of the diffraction spectrum (for example, comparing the −1st and +1$^{st}$ orders in the diffraction spectrum of a periodic grating). This can be done simply as is described, for example, in U.S. patent application publication US2006-066855, which is incorporated herein in its entirety by reference.

Significant aspects to enabling a patterning process include developing the process itself, setting it up for monitoring and control and then actually monitoring and controlling the process itself. Assuming a configuration of the fundamentals of the patterning process (such as the patterning device pattern(s), the resist type(s), post-lithography process steps (such as the development, etch, etc.), etc.), it is desirable to setup the lithographic apparatus for transferring the pattern onto the substrates, develop one or more metrology targets to monitor the process, setup up a metrology process to measure the metrology targets and then implement a process of monitoring and controlling the process based on measurements. While discussion in this application will consider an embodiment of a metrology process and metrology target designed to measure overlay between one or more layers of a device being formed on a substrate, the embodiments herein are equally applicable to other metrology processes and targets, such as process and targets to measure alignment (e.g., between a patterning device and a substrate), process and targets to measure critical dimension, etc. Accordingly, the references herein to overlay metrology targets, overlay data, etc. should be considered as suitably modified to enable other kinds of metrology processes and targets.

Figure 3:
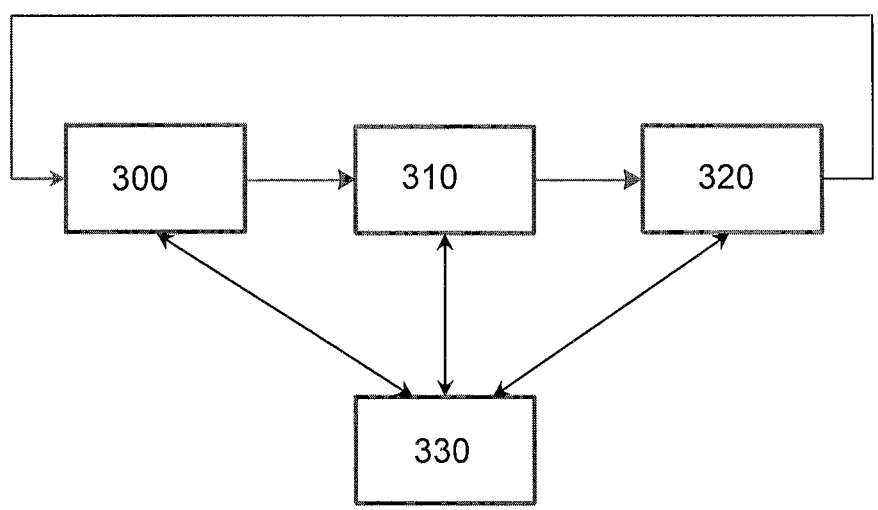
FIG. 3 schematically depicts an embodiment of a lithographic processing, metrology, and patterning device modification system.

Referring to FIG. 3, a lithographic processing, metrology, and patterning device modification system is shown. The system comprises a patterning system (e.g., a nanoimprint lithography tool, an optical lithographic apparatus such as described in respect of FIG. 1, a track tool such as described in respect of FIG. 2, an etch tool, another apparatus in the patterning process, or any combination selected therefrom) 300, a metrology apparatus 310, a patterning device modification tool 320, and a software application 330. Some, or all, of the patterning system 300, the metrology apparatus 310, and the patterning device modification tool 320 are in communication with the software application 330 so that results, designs, data, etc. of the patterning system 300, the metrology apparatus 310, and/or the patterning device modification tool 320 may be stored and analyzed by the software application 330 at the same time or different times.

As mentioned above, the patterning system 300 may be configured as the lithographic apparatus LA in FIG. 1. The patterning system 300 may be setup for executing the patterning aspect of the patterning process and optionally, may be configured to correct for deviations occurring within the patterning system 300 or in one or more other processes or apparatuses in the patterning process. In an embodiment, the patterning system 300 may be able to apply a correction of an error (e.g., imaging error, focus error, dose error, etc.) by adjusting one or more modification apparatuses of the patterning system 300. That is, in an embodiment, correction can be made by any manufacturing processing tool in the patterning system that can purposefully modify a patterning error.

Where, for example, the patterning system 300 comprises an optical lithographic apparatus, correction of an error can be made by adjusting one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT and/or the positioner PW of the substrate table WT to correct or modify the position of the patterning device support structure MT and/or the substrate table WT respectively, etc. Where, for example, the patterning system 300 comprises a track tool, correction of an error can be made by adjusting one or more modification apparatuses of the track tool, e.g., modifying a bake temperature of a bake tool of the track, modifying a development parameter of a development tool of the track, etc. Similarly, where, for example, the patterning system 300 comprises an etch tool, correction of an error can be made by adjusting one or more modification apparatuses of the etch tool, e.g., modifying an etch parameter, such as etchant type, etchant rate, etc. Similarly, where, for example, the patterning system 300 comprises a planarization tool, correction of an error can be made by adjusting one or more modification apparatuses of the planarization tool, e.g., modifying a planarization parameter. Similarly, where, for example, the patterning system 300 comprises a deposition tool, correction of an error can be made by adjusting one or more modification apparatuses of the deposition tool, e.g., modifying a deposition parameter.

In an embodiment, one or more modification apparatuses of the patterning system 300 may be able to apply up to third order polynomial correction of errors (e.g., imaging error, focus error, dose error, etc.).

The metrology apparatus 310 is configured to obtain measurements related to substrates printed with patterns by the patterning system 300. In an embodiment, the metrology apparatus 310 is configured to measure or determine one or more parameters (e.g., overlay error, dose, focus, CD, etc.) of the patterns printed by the patterning system 300. In an embodiment, the metrology apparatus 310 is a diffraction-based overlay metrology tool that can measure, e.g., overlay, critical dimension and/or other parameters. In an embodiment, the metrology apparatus 310 is an alignment apparatus used to measure relative position between two objects, such as between a patterning device and a substrate. In an embodiment, the metrology apparatus 310 is a level sensor to measure a position of a surface, e.g., a height and/or rotational position of a substrate surface.

In an embodiment, the metrology apparatus 310 measures and/or determines one or more values of one or more parameters (e.g., overlay error, CD, focus, dose, etc.) associated with an error in the patterning process. After the metrology apparatus 310 finishes the measurement or determination, the software application 330 creates modification information based on the measurement data (e.g., overlay error, CD, focus, dose, etc.). In an embodiment, the software application 330 evaluates the one or more values of the one or more parameters to determine if they are within a tolerance range. If not, the software application 330 determines modification information to correct an error reflected by the out of tolerance one or more values of the one or more parameters. In an embodiment, the software application 330 uses one or more mathematical models to determine error correctable by one or more modification apparatuses of the patterning system 300 and to provide information for one or more parameters (e.g. modification information) of the one or more modification apparatuses of the patterning system 300, which one or more parameters enable configuration of the one or more modification apparatuses of the patterning system 300 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning system 300. In an embodiment, the model specifies a range of modifications that one or more of the modification apparatuses of the patterning system 300 can make and determines correctable error within the range. That is, the range may specify an upper limit, a lower limit, and/or both on the amount of modifications that a particular modification apparatus of the patterning system 300 can make.

In an embodiment, the software application 330 uses one or more mathematical models to determine error correctable by the patterning device modification tool 320 and to provide information for one or more parameters (e.g. modification information) of the patterning device modification tool 320, which one or more parameters enable configuration of the patterning device modification tool 320 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning device modification tool 320. In an embodiment, the model specifies a range of modifications that the patterning device modification tool 320 can make and determines correctable error within the range. That is, the range may specify an upper limit, a lower limit, and/or both on the amount of modifications that the patterning device modification tool 320.

In an embodiment, co-optimization of the determination of the error correctable by respectively one or more modification apparatuses of the patterning system 300 and correctable by the patterning device modification tool 320 is provided. In an embodiment, co-optimization of the determination of the error correctable by a plurality of modification apparatuses of the patterning system 300 is provided. In an embodiment, the one or more mathematical models to determine error correctable by one or more modification apparatuses of the patterning system 300 and/or the one or more mathematical models to determine error correctable by the patterning device modification tool 320 are used and/or combined to enable the co-optimization. In an embodiment, the co-optimization leads to transformation of a non-correctable error by a modification apparatus of the patterning system 300 to a correctable error by one or more other modification apparatuses of the patterning system 300 and/or by a modification of the patterning device by a patterning device modification tool 320. As an example of such transformation, an error having an uncorrectable spatial resolution for a modification apparatus of the patterning system 300 can be enabled for correction by adding further error such that the total error has a spatial resolution correctable by the modification apparatus of the patterning system 300. In an embodiment, the added error is divided among a plurality of other modification apparatuses of the patterning system 300 or divided among one or more other modification apparatuses of the patterning system 300 and the patterning device modification tool 320.

In an embodiment, the co-optimization is performed separately or on a combined basis for different types of error, such as performed separately or on a combined basis for overlay error, focus error, dose error, etc. In an embodiment, certain modification apparatuses of the patterning system 300 may be better able to correct certain types of error and so the error correction is appropriately weighted or apportioned among the suitable different modification apparatuses of the patterning system 300.

In an embodiment, a user may specify the one or more mathematical models from a collection of a plurality of mathematical models, whether that mathematical model is determined to be a fit or not. For example, an interface (such as a graphical user interface) may allow the user to specify the mathematical data model for consideration. In an embodiment, a plurality of measurement mathematical data models is determined or specified. In an embodiment, the one or more mathematical models may be tuned for optimal noise suppression (e.g., eliminating redundant orders or reducing the use of higher orders).

For example, in an embodiment, the correctable error $\Delta x$ in an x direction at the coordinate (x,y), is modeled by:

$$\Delta x = k_1 + k_3 x + k_5 y + k_7 x^2 + k_9 xy + k_{11} y^2 + k_{13} x^3 + k_{15} x^2 y + k_{17} xy^2 + k_{19} y^3 \quad (1)$$

where $k_1$ is a parameter (that may be constant), and $k_3$, $k_5$, $k_7$, $k_9$, $k_{11}$, $k_{13}$, $k_{15}$, $k_{17}$, and $k_{19}$ are parameters (that may be constant) for the terms x, y, $x^2$, xy, $y^2$, $x^3$, $x^2y$, $xy^2$, and $y^3$, respectively. One or more of $k_1$, $k_3$, $k_5$, $k_7$, $k_9$, $k_{11}$, $k_{13}$, $k_{15}$, $k_{17}$, and $k_{19}$ may be zero.

Relatedly, in an embodiment, the correctable error $\Delta y$ in a y direction at the coordinate (x,y), is modeled by:

$$\Delta y = k_2 + k_4 y + k_6 x + k_8 y^2 + k_{10} yx + k_{12} x^2 + k_{14} y^3 + k_{16} y^2 x + k_{18} yx^2 + k_{20} x^3 \quad (2)$$

where $k_2$ is a parameter (that may be constant), and $k_4$, $k_6$, $k_8$, $k_{10}$, $k_{12}$, $k_{14}$, $k_{16}$, $k_{18}$, and $k_{20}$ are parameters (that may be constant) for the terms y, x, $y^2$, yx, $x^2$, $y^3$, $y^2x$, $yx^2$, and $x^3$, respectively. One or more of $k_2$, $k_4$, $k_6$, $k_8$, $k_{10}$, $k_{12}$, $k_{14}$, $k_{16}$, $k_{18}$, and $k_{20}$ may be zero.

In an embodiment, at least part of the correctable error is corrected by the patterning system 300 through adjusting one or more of the modification apparatuses of the patterning system 300. So, in an embodiment, a portion of the error that fits the mathematical model is correctable by the patterning system 300 by adjusting one or more modification apparatuses of the patterning system 300.

A minimum remaining systematic variation for certain substrates processed in a patterning process may be specific to particular sub-processes or devices used in the processing of the substrates. The minimum remaining systematic variation is sometimes referred to as a fingerprint. The fingerprint may not be correctable by one or more modification apparatuses of the patterning system 300. In an embodiment, the fingerprint is corrected by modifying the patterning device using the patterning device modification tool 320. In an embodiment, remaining systematic variation between the measurement data and the corresponding data calculated using the model (1) and model (2) is minimized by optimizing parameters (e.g., one or more of $k_1$-$k_{20}$).

In an embodiment, the software application 330 creates first modification information for modifying the patterning device by the patterning device modification tool 320 and transmits the first modification information to the patterning device modification tool 320. In an embodiment, the first modification information effectively transforms non-correctable error by the patterning system 300 to a correctable error for the patterning system 300 upon modification by the patterning device based on the first modification information. In an embodiment, after modifying the patterning device, the software application 330 instructs the patterning device modification tool 320 to transmit the modified patterning device to the patterning system 300 for use, in for example, production. In an embodiment, further error correction and/or verification of the modified patterning device is performed as discussed below.

In an embodiment, the software application 330 further creates second modification information for one or more modification apparatuses of the patterning system 300 and transmits the second modification information to the patterning system 300. In an embodiment, the second modification information enables correction of correctable error of the patterning process by the one or more modification apparatus of the patterning system 300 upon adjustment, based upon the second modification information, of the patterning process by the one or more modification apparatuses of the patterning system 300 and use of the modified patterning device in the patterning system 300. That is, in an embodiment, one or more modification apparatus of the patterning system 300 are configured to correct the correctable error produced by the patterning device modified based on the first modification information. In an embodiment, additionally or alternatively, the second modification information corrects residual patterning error remaining after modification of the patterning device based on the first modification information.

In an embodiment, a substrate processed in the patterning system 300 with the modified patterning device and/or adjusted patterning process is forwarded to the metrology apparatus 310 for measurement. The metrology apparatus 310 performs measurement in a similar way as discussed above to evaluate whether error is within a tolerance range (e.g., by evaluating one or more values of one or more parameters (e.g., overlay error, CD, focus, dose, etc.) of the substrate measured or determined by the metrology apparatus 310). If the error is not within tolerance, in an embodiment, additional modification of the patterning device by the patterning device modification tool 320 and/or adjustment of the one or more parameters of the one or more modification apparatuses of the patterning system 300 is performed as similarly discussed herein.

Figure 4:
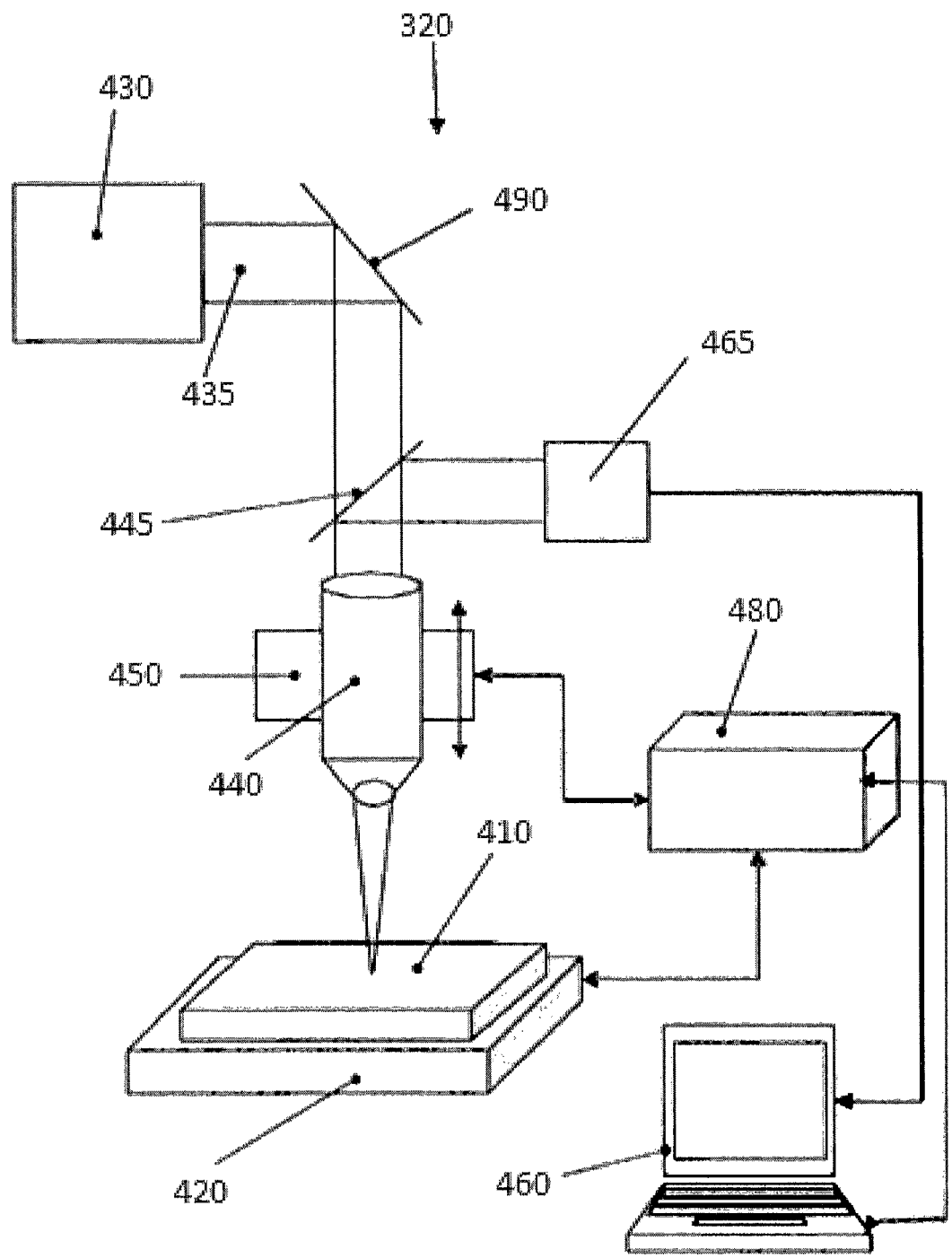
FIG. 4 schematically depicts an embodiment of a patterning device modification tool.

FIG. 4 schematically depicts a block diagram of an example patterning device modification tool 320 configured to modify a substrate of a patterning device (e.g., a photolithographic mask, an imprint template for nanoimprint lithography, etc.). The patterning device modification tool 320 comprises a table 420 which may be movable in up to six dimensions. The patterning device 410 may be held by the table 420 by using, for example, clamping.

The patterning device modification tool 320 includes a radiation source (e.g., a pulse laser source) 430 configured to produce a beam of radiation 435 (e.g., pulses of radiation). The source 430 generates radiation pulses of variable duration. Typically, the source is configured to have a photon energy which is smaller than the band gap of the substrate of the patterning device 410 and able to generate pulses with durations in the femtosecond range.

The femtosecond or ultra-short radiation pulses from the source 430 (e.g., a laser system) can, for example, write an arrangement of local density and/or transmission variations in the substrate of the patterning device by altering a material property of the substrate. The local density variation may shift one or more pattern elements on the surface of the patterning device to a predetermined position. Thus, the induced density variation of the substrate can modify or correct, for example, pattern placement on the surface of the patterning device. Additionally or alternatively, an arrangement of local transmission variations can be written in the substrate of the patterning device which modifies or corrects optical transmission of radiation passing through the patterning device. In this manner, modifications or corrections can be implemented without inducing a shift of one or more pattern elements on the surface of the substrate of the patterning device. An arrangement of local density and transmission variations can be defined and written which modifies or corrects pattern placement and optical transmission. In an embodiment, the local density and/or transmission variations may be introduced in a central or inner portion of the substrate. Local density and/or transmission variations in a central or inner portion of the substrate may avoid a bending of a portion of the substrate, which might introduce defects resulting in further error on the substrate patterned with the patterning device.

The steering mirror 490 directs the beam 435 into focusing objective 440. The objective 440 focuses the beam 435 onto the patterning device 410. The patterning device modification tool 320 also includes a controller 480 and a computer system 460 which manage the translations of the positioning stage of the table 420 in plane generally perpendicular to the beam (x and/or y directions) and/or translations about an axis parallel to the plane (about the x and/or y direction). The controller 480 and the computer system 460 may control the translation of the table 420 in a direction perpendicular to the plane (z direction) and/or rotation about that direction (about the z direction). Additionally or alternatively, the controller 480 and the computer system 460 may control the translation and/or rotations of the objective 440 via the positioning stage 450 to which the objective 440 is fixed. In an embodiment, the objective is fixed and all motions are performed using the table 420. In an embodiment, the patterning device modification tool 320 may comprise one or more sensors (not shown for convenience only) to detect positions of components, such as the table 420 and/or objective 440, determine focusing/leveling, etc.

The patterning device modification tool 320 may also provide a viewing system including a CCD (charge-coupled device) camera 465, which receives radiation from an illumination source arranged in the table 420 via optical element 445. The viewing system facilitates navigation of the patterning device 410 to the target position. Further, the viewing system may also be used to observe the formation of a modified area on the substrate material of the patterning device 410 by the beam 435 of the source 430.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer 460 may further comprise I/O (input/output) units like a keyboard, a touchpad, a mouse, a video/graphic display, a printer, etc. In addition, the computer system 460 may also comprise a volatile and/or a non-volatile memory. The computer system 460 may be realized in hardware, software, firmware, or any combination thereof. Moreover, the computer 460 may control the source 430. The computer system 460 may contain one or more algorithms, realized in hardware, software or both, which allow creation of control signals for the patterning device modification tool 320 from received data, e.g., experimental data. The control signals may control the writing of an arrangement of local density and/or transmission variations in the substrate of the patterning device 410 in order to, for example, correct the pattern placement or optical transmission in accordance with the received data. In particular, the computer system 460 may control the source 430 and/or the table 420 positioning and/or the objective 440 positioning or optical parameters and/or the CCD camera 465.

In an embodiment, the effects of local density and/or transmission variations may be described by a physical mathematical model that represents the deformation caused by the beam. The direction of the deformation is controlled by applying different local density and/or transmission variations in the substrate having different deformation properties. The deformation properties of a given local density and/or transmission variation, such as magnitude and direction represent a specific mode. For example, an "X mode" represents a deformation along the X axis and is described by the "X mode" deformation properties. When the control signals are calculated, the one or more algorithms compute where and in what density each type of local density and/or transmission variations should be written. For example, a registration error in the X direction can be corrected by an X mode type of local density and/or transmission variations. The model can use several modes in order to optimize a best possible solution for a specific problem. Typically X and Y modes which are orthogonal to each other will be used but other modes such as 45° and 135° may also be used if required.

So, in an example patterning device production process, a pattern of absorbing elements is written on an absorbing layer on the substrate of a patterning device with a pattern generator. In a subsequent etching process, the absorbing pattern elements are formed from the absorbing material. A material often used for the absorbing layer on patterning devices is chromium or tungsten.

In an example patterning device modification process, the positions of the generated absorbing pattern elements may be determined with a registration metrology system in order to determine whether, e.g., the pattern writing process was successful, i.e. the pattern elements have their predetermined size and form and are at the desired positions. Additionally or alternatively, as discussed herein, one or more patterning errors may be determined (e.g., by measurement and/or simulation). If the determined errors are not within a predetermined level, an arrangement of local density and/or transmission variations are written into the substrate of the patterning device using, for example, the patterning device modification tool 320 of FIG. 4. The local density variations can shift the position of one or more pattern elements in or on the patterning device to a predetermined position and the local transmission variations can cause one or more pattern elements to behave differently in terms of imparting a pattern to the beam. Then, it may be measured whether the modification of the patterning device was successful. For example, if the measured positioning error is now below the predetermined threshold, the patterning device may be further processed (e.g., the addition of a pellicle) or used directly in production.

In an embodiment, the patterning device modification tool 320 comprises the tool that writes the pattern of the patterning device. For example, an e-beam writer may be used to create the pattern of the patterning device. The modification information described herein may be provided to such a tool to modify creation of the patterning device. In such a case, the modification information may be determined based on measurement and/or simulation results using other copies of the patterning device or using similar patterning devices. Such data may be supplemented by measured data of the patterning device that is being created (e.g., measurements obtained at the time of creation of the patterning device).

Figure 5:
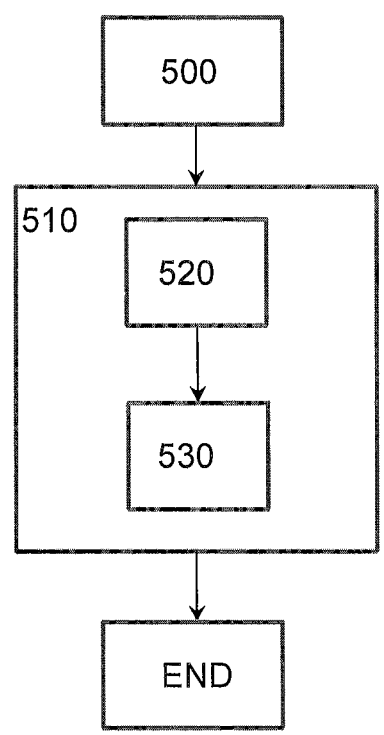
FIG. 5 schematically depicts a flow diagram of an embodiment of a method of patterning device modification by a patterning device modification tool.

Referring to FIG. 5, a flow diagram of an embodiment of a method of patterning device modification is shown. The method conducted in the flow diagram of FIG. 5 may be performed by the software application 330.

At 500, information regarding an error in patterning is obtained for a patterning device for use in a patterning system. In an embodiment, the patterning error is an error in addition to, or other than, a patterning device registration error. In an embodiment, a portion of the error is not correctable by a modification apparatus of a patterning system (e.g., the patterning system 300). In an embodiment, the patterning error information is derived based on measurement and/or simulation. In an embodiment, the patterning error information comprises one or more selected from: critical dimension information, overlay error information, focus information, and/or dose information.

At 510, modification information for modifying a patterning device based on the error information is created. In an embodiment, the modification information transforms the portion of the error to correctable error for the modification apparatus of the patterning system when the patterning device is modified according to the modification information. In an embodiment, the modification information is created based on a modification range of the modification apparatus of the patterning system. In an embodiment, the modification information is used by a patterning device modification tool 320 (such as a system the same as or similar to the system described in respect of FIG. 4).

In an embodiment, at 510, modification information for the modification apparatus of the patterning system is created based on the error information and modification information for modifying the patterning device, wherein the modification information for the modification apparatus of the patterning system includes information regarding the correctable error produced by the modified patterning device. In an embodiment, modification information for modifying the patterning device and modification information for adjusting the modification apparatus of the patterning system are co-optimized.

In an embodiment, at 510, the modification information is converted 520 to a recipe that spatially distributes across the patterning device one or more induced local density and/or transmission variations within a substrate of the patterning device. The spatially distributed one or more induced local density and/or transmission variations transform the portion of the patterning error to a correctable error for the patterning system (e.g., the patterning system 300). At 530, the one or more induced local density and/or transmission variations are created within the substrate of the patterning device. In an embodiment, creating the induced local density and/or transmission variation comprises creating the induced local density and/or transmission variation by using laser pulses to change a material property of the substrate as described above with respect to FIG. 4. The method is then finished.

Figure 6:
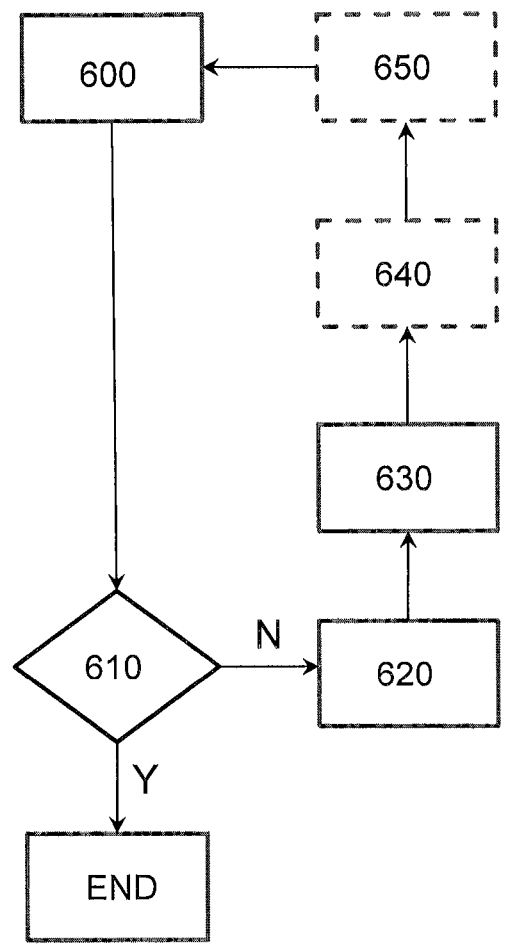
FIG. 6 schematically depicts a flow diagram of an embodiment of a method of patterning error modification.

Referring to FIG. 6, a flow diagram of an embodiment of a method of patterning error modification is depicted. The method conducted in the flow diagram of FIG. 6 may be performed by the software application 330.

At 600, first patterning error information is obtained in relation to a patterning device. In an embodiment, the first patterning error information is obtained from the metrology apparatus 310 through measurement. In an embodiment, the first patterning error information is obtained through simulation. The first patterning error information may comprise one or more selected from: critical dimension information, overlay error information, focus information, and/or dose information.

At 610, it is determined whether the first patterning error information is within a certain tolerance range. If the first patterning error information is within the tolerance range, the method is finished. Otherwise, the method proceeds to 620.

At 620, first modification information for a patterning device based on the first patterning error information is created. The first modification information instructs or enables a patterning device modification tool (e.g., the patterning device modification tool 320) to implement a modification (e.g., a deformation modification) of the patterning device. At 630, the first modification information is transmitted to the patterning device modification tool.

At 640, optionally, second modification information for the patterning system (e.g., the patterning system 300) based on the first patterning error information and the first modification information is created. The second modification information instructs or enables the patterning system to implement an adjustment (e.g., a distortion correction) of the patterning process by adjusting one or more modification apparatuses of the patterning system. At 650, the second modification information is transmitted to the patterning system.

The method returns to 600, where second patterning error information is obtained for the patterning device modified according to the first modification information and the patterning system adjusted according to the second modification information. Next, at 610, it is determined whether the second patterning error information is within a tolerance range. If the second patterning error information is not within tolerance, the method proceeds to 620, where third modification information is created for the modified patterning device based on the second patterning error information. The third modification information instructs or enables a patterning device modification tool (e.g., the patterning device modification tool 320) to implement a modification (e.g., a deformation modification) of the modified patterning device. At 630, the third modification information is transmitted to the patterning device modification tool. Similarly, fourth modification information for one or more modification apparatuses of the patterning system (e.g., the patterning system 300) based on the second patterning error information and the third modification information may be created and transmitted to the patterning system. Such iterative modification of the patterning device and/or patterning system may continue until the patterning error information is within tolerance.

In an embodiment, the patterning device modification is made in increments. That is, modification information is produced that transforms non-correctable error to error that is correctable by the patterning system 300 by a first level of 100%, more than or equal to 98%, more than or equal to 95%, or more than or equal to 90% and/or that reduces error by a first level of 100%, more than or equal to 98%, more than or equal to 95%, more than or equal to 90%. Then, that modification information is reconfigured so that the modification information corrects to a second level less than the first level, e.g., 95% or less of the first level, 90% or less of the first level, or 85% or less of the first level. The patterning device is then modified according to the modification information for the second level so only part of the error is corrected. Then the modified patterning device is evaluated using a further simulation and/or measurement result in relation to the patterning system to arrive at a further modification at a third level to reduce the difference between the first and second levels. In this manner, for example, overcorrection may be avoided. For example, there may be long term drift in the patterning system and/or deltas between the set points of a modification apparatus of a patterning system and the actual performance of the modification apparatus that can be accounted for in the further correction(s) that may have not been properly accounted for in a first correction.

A hotspot is referred to as an area or a location comprising one or more pattern features where a defect is produced or is likely to be produced. For example, the hotspot may be an area or a location where adjacent pattern lines are designed to be spaced close to, but apart from, each other but who join, or are likely to join, together. A defect produced by a hotspot (e.g., the joined pattern lines) may cause failure or significant electrical problems of a device. A root cause of the hotspot may include focus shift, dose shift, illumination change, wavefront change due to optical aberration, etc. A solution to fix a hotspot in, for example, a lithographic imaging system may be through adjusting dose and/or focus of the lithographic imaging system. But, such a solution (or other solutions) may not accurately or completely correct an error associated with a hotspot due to limited spatial frequency resolution of a modification apparatus of a patterning system.

Figure 7:
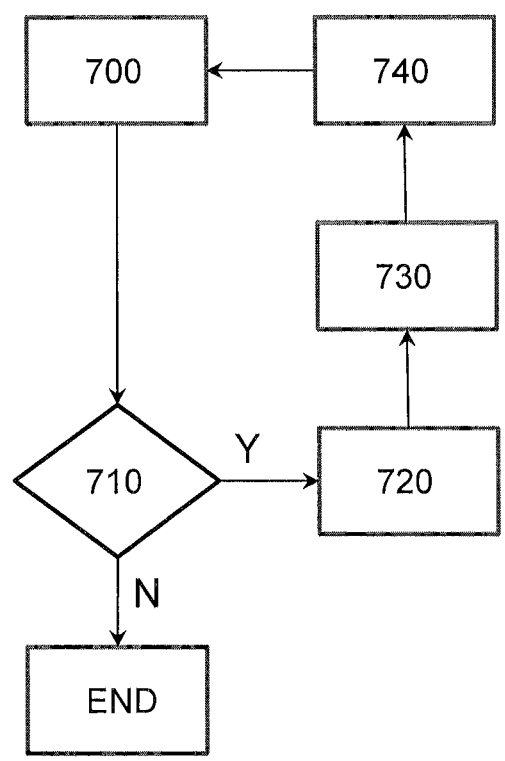
FIG. 7 schematically depicts a flow diagram of an embodiment of a method of hotspot control.

So, referring to FIG. 7, a flow diagram of an embodiment of a method of hotspot control is depicted. The method conducted in the flow diagram of FIG. 7 may be performed by the software application 330 to reduce, or eliminate, an error associated with a hotspot. At 700, a measurement result of a first pattern provided to an area of a first substrate, and/or a simulation result for the first pattern to be provided to the area of a first substrate is obtained. The first pattern is provided, or to be provided, by using a patterning device in a patterning system (e.g., the patterning system 300). In an embodiment, the measurement result of the first pattern on the area of the first substrate is obtained from the metrology apparatus 310.

At 710, it is determined whether the area of the first substrate comprises a hotspot based on the measurement and/or simulation result of the first pattern. In an embodiment, the hotspot is identified by a patterning process mathematical simulation by identifying which one or more pattern features of a pattern (or portion thereof) that act as limiting the process window of the pattern (or portion thereof) in the patterning process. The features in a pattern (or portion thereof) may have different process windows (i.e., a space of the processing parameters (e.g. dose and focus) under which a feature will be produced within specification). Examples of specifications that relate to potential systematic defects include checks for necking, line pull back, line thinning, CD, edge placement, overlapping, resist top loss, resist undercut and/or bridging. The process window of all the features in the pattern (or the portion thereof) may be obtained by merging (e.g., overlapping) process windows of each individual feature. The boundary of the process window of all the features contains boundaries of process windows of some of the individual features. These individual features that define the boundary of the process window of all the features limit the process window of all the features; these features can be identified as "hot spots." When it is determined the area of the first substrate comprises a hotspot, the method proceeds to 720. Otherwise, the method is finished.

At 720, first error information at the hotspot is determined. In an embodiment, the first error information is derived based on measurement of physical structures produced using the patterning device in the patterning system and/or based on simulation of physical structures to be produced using the patterning device in the patterning system.

At 730, first modification information for the patterning device based on the first error information is created to obtain a modified patterning device. In an embodiment, the first error information comprises one or more selected from: critical dimension information, overlay error information, focus information, and/or dose information. In an embodiment, the first error comprises first non-correctable error by the patterning system.

At 740, the modification information and the patterning device are transmitted to the patterning device modification tool (e.g., the patterning device modification tool 320) to modify the patterning device based on the first modification information. In an embodiment, the first non-correctable error is transformed to a correctable error by one or more modification apparatuses of the patterning system, by modifying the patterning device according to the first modification information. In an embodiment, patterning system modification information is created for the one or more modifying apparatuses of the patterning system to correct the correctable error of the modified patterning device and is provided to the patterning system to implement the correction represented by the patterning system modification information. The modified patterning device may then be used in production.

Optionally, the method returns to 700 where a measurement result of a second pattern provided to an area of a second substrate, and/or a simulation result for the second pattern to be provided to the area of a second substrate is obtained. The second pattern is provided, or to be provided, by using the modified patterning device in the patterning system (e.g., the patterning system 300). In an embodiment, the measurement of the second pattern on the area of the second substrate is obtained from the metrology apparatus 310. In an embodiment, the second substrate is the first substrate after reworking. In an embodiment, the second substrate is a different substrate.

At 710, it is determined whether the area of the second substrate comprises a hotspot based on the measurement and/or simulation result of the second pattern. If it is identified that the area of the second substrate comprises a hotspot, the method proceeds to 720. Otherwise, the method is finished.

At 720, second error information at the area of the second substrate where there is a hotspot is determined. In an embodiment, the second error information is derived based on measurement of physical structures produced using the modified patterning device in the patterning system and/or based on simulation of physical structures to be produced using the modified patterning device in the patterning system. In an embodiment, the second error comprises second correctable error by the patterning system. In an embodiment, the second error comprises second non-correctable error by the patterning system. In an embodiment, the second error information comprises one or more selected from: critical dimension information, overlay error information, focus information, and/or dose information.

At 730, second modification information for the modified patterning device is created based on the second error information. In an embodiment, at 740, the second modification information and the modified patterning device are transmitted to the patterning device modification tool for modifying the corrected patterning device according to the second modification information. In an embodiment, the second non-correctable error is transformed to a correctable error by one or more modification apparatuses of the patterning system, by modifying the patterning device according to the first modification information. In an embodiment, patterning system modification information is created for the one or more modifying apparatuses of the patterning system to correct the correctable error of the modified patterning device and is provided to the patterning system to implement the correction represented by the patterning system modification information. The method then optionally returns to 700. Such iterative modification continues until an error associated with one or more hotspots is within a tolerance range.

In an embodiment, the patterning device modification comprises adding shading/scattering elements to the patterning device substrate to control radiation passing through the patterning device and thus control dose. In an embodiment, the patterning device modification comprises a Z deformation to the patterning device substrate to focus of the radiation passing through the patterning device.

In an embodiment, the patterning device modification comprises changing the illumination pupil. That is, depending on the extent of Z deformation to the patterning device substrate, a blur can be caused in the illumination pupil, which can compensate, for example, aberration in the projection system.

Figure 8:
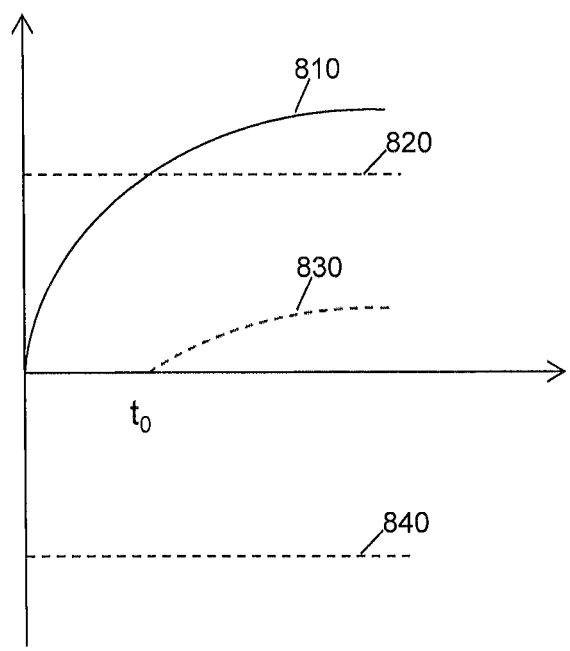
FIG. 8 schematically depicts a graph of error correction applied before combining an error offset.

Referring to FIG. 8, an example graph of a modification to a patterning process by a modification apparatus of a patterning system is depicted. The horizontal axis represents time, and the vertical axis represents a parameter of the modification. In an embodiment, the parameter is a parameter of the modification apparatus of the patterning system that defines a modification (e.g., error correction) it applies to the patterning process. For example, the parameters may be a parameter of models (1) or (2). So, in an embodiment, the graph depicts an example modification or error correction 810 over time by the modification apparatus of the patterning system. As shown in FIG. 8, the modification range of the modification apparatus of the patterning system (e.g., the patterning system 300) is between a lower modification limit 840 and an upper modification limit 820. The error correction 810 increases over time due a time-varying effect, such as projection system heating and/or patterning device heating. The modification 810 stays in the modification range until time $t_0$. After time $t_0$, the modification exceeds, in this case, the upper modification limit 820 of the modification apparatus of the patterning system. As a result, a residual correction error 830 is introduced. The residual correction error may be the difference between the modification 810 and the upper modification limit 820 that is produced after time $t_0$. In an embodiment, the residual correction error 830 cannot be corrected by adjusting one or more modification apparatuses of the patterning system, and may continue to increase over time. The residual correction error 830 may be, or represent, an error in a parameter of the patterning process. For example, the residual correction error 830 may be, or represent, an overlay error penalty. That is, in an embodiment, the error correction 810 corrects a significant portion of overlay error but because of the "clipping" (i.e., the desired correction 810 crosses a modification limit of the modification apparatus of the patterning system), a portion of the overlay error is not corrected, i.e., an overlay penalty.

In an embodiment, to reduce, if not eliminate, the residual correction error 830 of a modification apparatus of the patterning system, an appropriate error offset is applied so that the combination of the error offset and the error correction 810 is within the error correction range of the modification apparatus of the patterning system or at least remains within the error correction range for a longer period of time than without the error offset.

Figure 9:
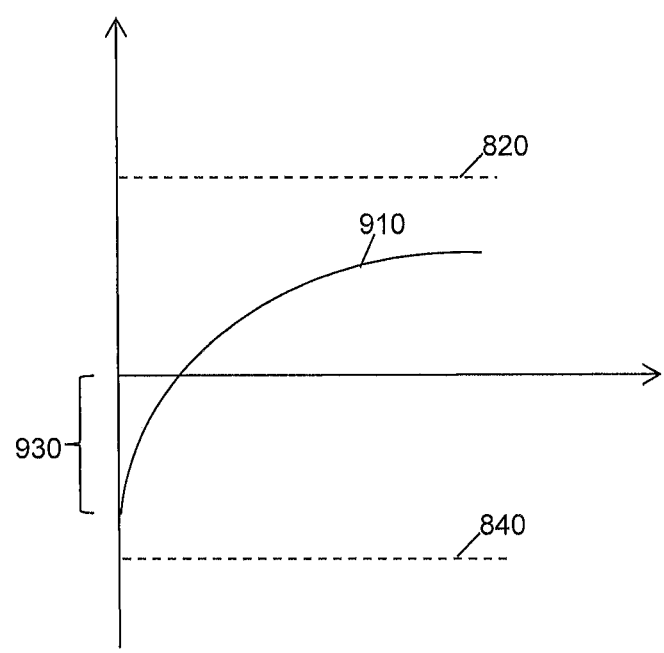
FIG. 9 schematically depicts a graph of error correction after combining an error offset.

Referring to FIG. 9, an example graph of an error correction combined with an error offset is depicted. In this example, a negative error offset 930 is applied. After applying the negative error offset 930, the combination of the error correction 810 (i.e., without error offset) and the negative error offset 930 is shown by the resulting error correction 910. As shown in FIG. 9, the resulting error correction 910 stays within the error correction range of the modification apparatus of the patterning system over an extended period of time (i.e., a period of time at least longer than without the error offset). In an embodiment, the period of time is as at least as long as period of time for a patterning device to print patterns on a single substrate. In an embodiment, the resulting error correction 910 does not "clip" the error correction range. Since the resulting error correction 910 changes over time, the correction may be referred to as dynamic correction (and is used to correct a dynamic error). While FIGS. 8 and 9 depicts relatively continuous and relatively smooth error corrections 810, 910, the error correction need not be and may be discontinuous (e.g., a stepped error correction comprising a plurality of discontinuities)

Various methods may be conducted to introduce the error offset (such a negative error offset 930) for dynamic correction. For example, in an embodiment, the error offset is introduced by modifying the patterning device using the patterning device modification tool (e.g., the patterning device modification tool 320). In an embodiment, additionally or alternatively, the error offset is introduced by another modification apparatus in the patterning system, such as adjustment mechanism AM, a track modification apparatus, etc. for use with, for example, a downstream modification apparatus that applies an error correction 810.

In an embodiment, the error correction 810 is out of the error correction range (e.g., beyond the upper modification limit 820 or below the lower modification limit 840) at the outset. This may be referred to a static error. In this case, an appropriate error offset may be introduced to put the error correction within the error correction range of the modification apparatus of the patterning system. Like for a dynamic error, in an embodiment, the error offset is introduced by modifying the patterning device using the patterning device modification tool (e.g., the patterning device modification tool 320) and/or by another modification apparatus in the patterning system, such as adjustment mechanism AM, a track modification apparatus, etc. for use with, for example, a downstream modification apparatus that applies an error correction 810. In an embodiment, a static error is combined with a dynamic error and thus the error offset would need to take account of the static error and at least part, if not all, of the dynamic error.

Figure 10:
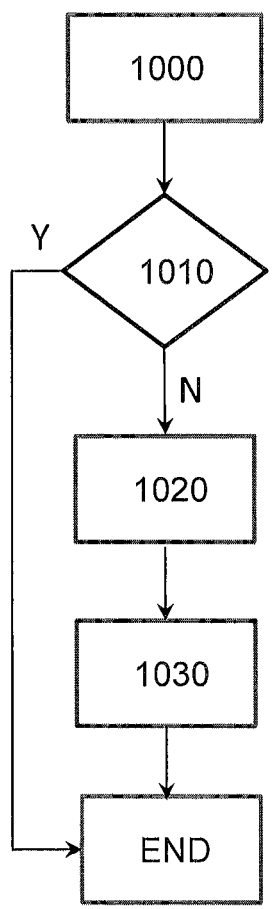
FIG. 10 schematically depicts a flow diagram of an embodiment of a method of error correction by using an error offset.

Referring to FIG. 10, a flow diagram of an embodiment of a method of error correction by combining an error offset is depicted. The method conducted in the flow diagram of FIG. 10 may be performed by the software application 330. At 1000, patterning error information is obtained for a patterning process involving a patterning device. In an embodiment, the patterning error information is obtained by measurement and/or by simulation. In an embodiment, the patterning error information comprises overlay error and/or patterning device registration error.

At 1010, it is determined, based on the patterning error information, whether the patterning error is correctable within a certain modification range (e.g., between the upper modification limit 820 and the lower modification limit 840) of a modification apparatus of the patterning system (e.g., the patterning system 300) for a designated time period (e.g., at the outset, over a certain finite time or at all times). If it is determined that the patterning error is not correctable within the error correction range for the designated period, the method proceeds to 1020. Otherwise, the method is finished.

At 1020, a patterning error offset for the modification apparatus of the patterning system is determined based on the patterning error information. The patterning error offset is selected that such the combination of the patterning error offset and the patterning error is correctable within the modification range of the modification apparatus of the patterning system for at least the designated time period.

In an embodiment, first modification information for a patterning device is created based on the patterning error offset at 1030. At least a portion of the patterning error offset is combined with the patterning error after the patterning device corrected according to the first modification information is used in the patterning system.

In an embodiment, additionally or alternatively to the first modification information, second modification information for one or more modification apparatuses in the patterning system is created based on the patterning error offset at 1030. At least a portion of the patterning error offset is combined with the patterning error after the one or more modification apparatuses of the patterning system are adjusted according to the second modification information is used in the patterning system. In an embodiment, the one or more modification apparatuses comprise adjuster AD, adjustment mechanism AM, and/or a modification apparatus in the track. In an embodiment, second modification information is created for a plurality of modification apparatuses of the patterning system, which together provide all or a portion of the patterning error offset.

Thus, in an embodiment, a patterning error offset can be provided to improve the overall range of one or modification apparatus of the patterning system. In particular, in an embodiment, a patterning device correction (or a correction made by another modification apparatus) can be implemented such that the available range of a modification apparatus of the patterning system can be used when subject to a dynamic patterning error (e.g., during heating of the projection system and/or patterning device during production in a lithographic apparatus). As an example, the patterning device offset can be introduced as an offset to a specific k-parameter of model (1) and/or (2) to a new different set-point, such that the patterning error remains in the modification apparatus range around that set-point. These modification information can be derived with knowledge of the known effects on one or more patterning process parameters (e.g., overlay) and the associated one or more modification apparatuses of the patterning system that can correct for the patterning errors (e.g., if the error is derived from projection system heating, then adjusting mechanism AM may be used).

In an embodiment, additionally or alternatively, the modification information for the patterning device is used to remove error that is correctable by one or more modification apparatuses of the patterning system that is known to be stable/static. Thus, one or more modification apparatuses of the patterning system can be used to correct for dynamic changes/variations.

In an embodiment, modification information can effectively reduce intra-field residual errors that are not correctable by a modification apparatus of the patterning system and/or induce an intra-field error fingerprint correctable by a modification apparatus in the patterning system. This modification information can be modification for a patterning device and/or one or more other modification apparatus of the patterning system. In an embodiment, there is provided modification information for one more modification apparatuses of the patterning system which corresponds to the intra-field error fingerprint.

In an embodiment, a fraction of the correction of the patterning error can be shifted between modification apparatuses of the patterning system or between patterning device modification and one or more modification apparatus of the patterning system. For example, at least part of an error correctable by a modification apparatus of the patterning system can be shifted to be corrected by patterning device modification. For example, at least part of an error uncorrectable by a modification apparatus of the patterning system can be shifted to be corrected by patterning device modification and leave a remainder that is correctable. As another example, at least part of an error correctable by a particular modification apparatus can be shifted to be corrected by another modification apparatus (including via shifting at least part of the error to patterning device modification). As another example, at least part of an error uncorrectable by a modification apparatus can be transformed to be corrected by patterning device modification and/or by another modification apparatus. As an example, some correction of a particular k term of model (1) or (2) can be made by patterning device modification in order than another k term of model (1) or (2) can be corrected by a modification apparatus of the patterning system.

In an embodiment, the optimization aims for lowest intra-field residuals (e.g., lowest overlay error residuals). In an embodiment, the optimization uses information specifying the range of spatial frequency correction available by modification of the patterning device using the patterning device modification tool and/or the range of spatial frequency correction available by one or more modification apparatuses of the patterning system (e.g., the information may be specified for all modification apparatuses or for individual or groups of modification apparatuses). In an embodiment, the spatial frequency information is specified for different directions (e.g., x direction, y direction, etc.).

It has been discovered that a patterning device may crack in view of clamping, heating, and other conditions applied to the patterning device in a patterning system. For example, a modification may be made to a patterning device as described herein to correct an error in the patterning device or patterning process. In an embodiment, such a modification involves inducing a material property change in the patterning device (e.g., a local density and/or transmission variation, which may involve a deformation of the patterning device). But, while such a modification may not lead to a crack in the patterning device, it has been realized that further conditions (such as clamping, heating, etc.) applied to the patterning device in the patterning system may, or do, lead to a crack of the patterning device. Thus, a modification of the patterning device as described herein may lead to a higher risk of cracking without so knowing. This can lead to costly damage, e.g., the expensive patterning device itself, contamination in the patterning system, downtime and time to repair/replace, etc.

Accordingly, in an embodiment, patterning system behavior knowledge and/or a patterning system model, together with the actual or intended patterning device modification, are used to arrive at an indication of actual or predicted cracking of the patterning device. In an embodiment, the patterning system behavior knowledge comprises temperature and/or deformation measurements of the patterning device in the patterning system. In an embodiment, the patterning system model comprises a model of expected temperature and/or deformation of the patterning device in the patterning system. In an embodiment, the model is based on empirical measurements and/or calculated based on first principles (e.g., calculated based on spatial distribution of radiation on the patterning device, the energy of the radiation, slit profile, etc., and/or calculated based on a clamping pressure, and/or calculated based on vibrations in the patterning system, and/or calculated based on stress from a pellicle, etc.). The patterning system information can be obtained from measurements during use (or from downtime), from patterning system settings, from patterning system calibration, etc. In an embodiment, the actual or intended patterning device modification comprises spatial location information of material property changes in the patterning device.

In an embodiment, for example, a distortion profile arising from the patterning device modifications can be combined (e.g., summed) with a distortion profile of the patterning device due to the patterning system to obtain a combined distortion profile. For example, the patterning system behavior knowledge and/or the patterning system model together with the actual or intended patterning device modification can be used to arrive at spatial distribution of strain or stress in the patterning device. The spatial distribution or profile can be two-dimensional or three-dimensional. Further, the spatial distribution or profile can be time-varying.

A measure of cracking can then be determined by evaluating the distortion profile (e.g., evaluating the spatial distribution of strain or stress). For example, cracking may occur when the strain or stress exceeds a particular threshold. In an embodiment, the patterning system behavior knowledge and/or the patterning system model comprises temporal information on the spatial distribution of temperature and/or deformation such that a time of cracking can be predicted.

If cracking is predicted, one or more measures may be taken. In an embodiment, one or more steps within the patterning process are altered to reduce stress or strain of the patterning device. As an example, a cooling period may be introduced or extended and/or an intensity of radiation changed. As another example, a clamping pressure may be reduced or released for a period of time. In an embodiment, the modification of the patterning device is altered prior to application to the patterning device or a further modification of the patterning device is made. In an embodiment, a modification made by a modification apparatus of the patterning system is co-optimized with a modification to the patterning device using a patterning device modification tool so that the risk of cracking is reduced or eliminated. In an embodiment, a non-modification apparatus adjustment (e.g., adding a cooling period) is co-optimized with a modification made by a modification apparatus of the patterning system and a modification to the patterning device using a patterning device modification tool. In an embodiment, the co-optimization is such that the total patterning device deformation over a designated time period (e.g., a finite amount of time, at all times, etc.) stays within a patterning device cracking threshold.

So, in an embodiment, a combination of information regarding the patterning device deformation in the patterning process with information regarding the patterning device modifications made by a patterning device modification tool enable prediction of cracking behavior. Further, in an embodiment, one or more changes in the patterning process, a modification of the patterning device, and/or an adjustment by a modification apparatus of the patterning device are used to provide that total patterning device deformation in the patterning system stays within a cracking threshold.

Figure 11:
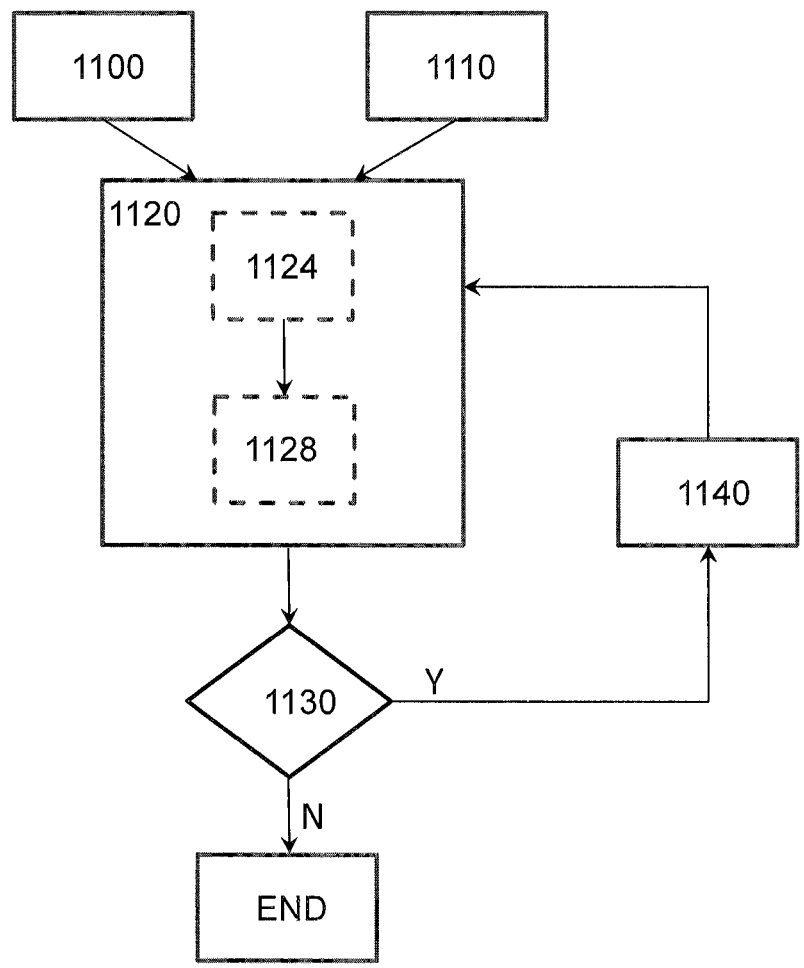
FIG. 11 schematically depicts a flow diagram of an embodiment of a method of patterning device cracking prevention.

As noted above, after modification by a patterning device modification tool (e.g., the patterning device modification tool 320), a patterning device has a higher risk of cracking during use in the patterning system (e.g., the patterning system 300). So, referring to FIG. 11, a flow diagram of an embodiment of a method of patterning device cracking prevention is depicted. The method conducted in the flow diagram of FIG. 11 may be performed by the software application 330.

At 1100, modification information of a patterning device is obtained. In an embodiment, the modification information comprises spatial distribution information of the modification. In an embodiment, the modification information describes a modification made or to be made by a pattern modification tool to the patterning device for a patterning process.

At 1110, a temperature and/or deformation spatial distribution of the patterning device arising in the patterning system is obtained. In an embodiment, the temperature and/or distribution of the patterning device is obtained from a model (e.g., through simulation) and/or by measurement.

At 1120, cracking behavior of the patterning device is predicted based on the modification information of the patterning device and on the spatial distribution of temperature and/or deformation of the patterning device. In an embodiment, step 1120 may comprise step 1124 and step 1128. At 1124, a stress or strain map of the patterning device is determined based on the modification information of the patterning device and on spatial distribution of temperature and/or deformation of the patterning device in the patterning process. At 1128, a measure of cracking is determined based on the stress or strain map of the patterning device.

At 1130, it is determined that the patterning device is predicted to crack responsive to the measure of cracking passing a patterning device crack threshold. In an embodiment, the measure of cracking comprises a cracking number that is evaluated against whether it passes a patterning device crack threshold. If the patterning device is predicted to crack, the method proceeds to 1140. Otherwise, the patterning device is predicted not to crack and the method is finished.

At 1140, one or more measures are taken to reduce, if not eliminate, the risk of cracking. In an embodiment, one or more steps within the patterning process are altered to reduce stress or strain of the patterning device. As an example, a cooling period may be introduced or extended. As another example, a clamping pressure may be reduced or released for a period of time. In an embodiment, the modification of the patterning device is altered prior to application to the patterning device or a further modification of the patterning device is made. In an embodiment, a modification made by a modification apparatus of the patterning system is co-optimized with a modification to the patterning device using a patterning device modification tool so that the risk of cracking is reduced or eliminated. In an embodiment, a non-modification apparatus adjustment (e.g., adding a cooling period) is co-optimized with a modification made by a modification apparatus of the patterning system and a modification to the patterning device using a patterning device modification tool. In an embodiment, the co-optimization is such that the total patterning device deformation over a designated time period (e.g., a finite amount of time, at all times, etc.) stays within a patterning device cracking threshold.

In an embodiment, step 1140 comprises creating first modification information that instructs the patterning device modification tool to implement a modification of the patterning device to keep the risk of cracking with a patterning device cracking threshold. In an embodiment, the first modification information is based on the co-optimization. In an embodiment, the first modification information is transmitted to the patterning device modification tool. In an embodiment, step 1140 additionally or alternatively further comprises creating second modification information that instructs the patterning system to implement an adjustment by one or more modification apparatuses of the patterning system. In an embodiment, the second modification information is based on the co-optimization. In an embodiment, the second modification information is transmitted to the one or more modification apparatuses of the patterning system.

The method then returns to 1120. The iterative modification method may continue until the measure of cracking is within a patterning device cracking threshold.

Figure 12:
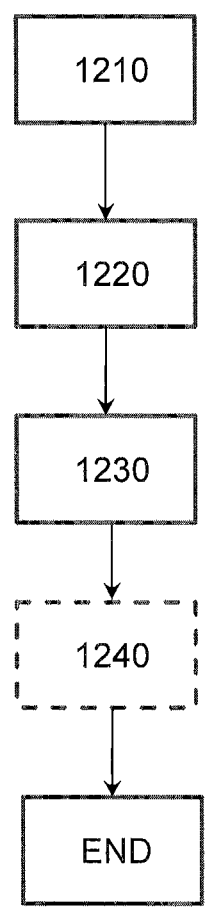
FIG. 12 schematically depicts a flow diagram of an embodiment of a method of patterning device cracking prevention.

Referring to FIG. 12, a flow diagram of an embodiment of a method of patterning device cracking prevention is depicted. The method conducted in the flow diagram of FIG. 12 may be performed by the patterning system 300 during exposure for patterning device cracking prevention. At 1210, a spatial temperature and/or deformation distribution of a patterning device in the patterning system is determined. In an embodiment, the spatial temperature and/or deformation distribution of the patterning device is determined by a temperature and/or deformation sensor in the patterning system (e.g., the patterning system 300). In an embodiment, the spatial temperature and/or deformation distribution of the patterning device is derived based on measurements of temperature and/or deformation at a plurality of locations on or near a surface of the patterning device. In an embodiment, the patterning device has been corrected by a patterning device modification tool (e.g., the patterning device modification tool 320).

At 1220, a prediction on cracking behavior of the patterning device is obtained based on the temperature and/or deformation distribution. In an embodiment, the patterning system transmits the temperature and/or deformation distribution of the patterning device to the software application 330. The patterning system further obtains prediction of the cracking behavior of the patterning device based on the temperature and/or deformation distribution of the patterning device and modification information for the patterning device from the software application 330.

At 1230, use of the patterning device in the patterning system is prevented responsive to indication that the patterning device has cracked or is going to crack. Optionally, at 1240, the patterning device is sent to a patterning device modification tool for modification after preventing use of the patterning device in the patterning system.

Both the patterning system (e.g., the patterning system 300) and the patterning device may contribute to error in producing substrates with the patterning system and the patterning device. The choice of patterning system and patterning device combination determines, for example, the magnitude of correctable and non-correctable error for the patterning system. Therefore, there is provided a method for providing optimal combinations of patterning systems and patterning devices.

Figure 13:
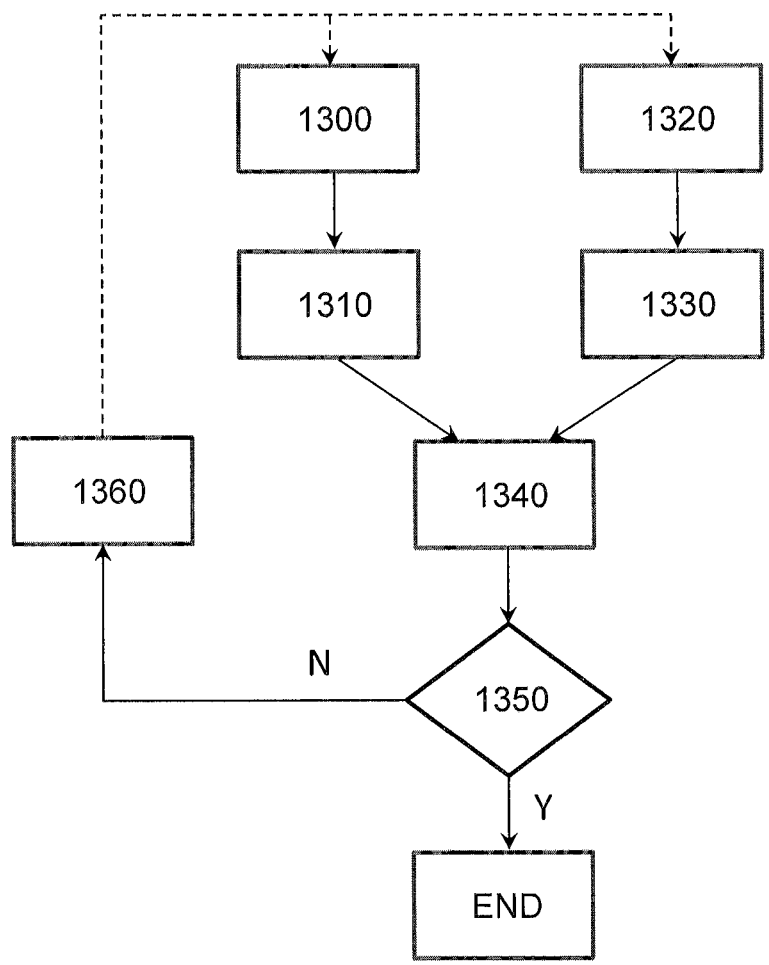
FIG. 13 schematically depicts a flow diagram of an embodiment of a method of patterning device to patterning device matching.

Referring to FIG. 13, a flow diagram of an embodiment of a method of patterning device to patterning device matching is depicted. In an embodiment, the patterning device to patterning device matching involves qualification of different patterning devices using the same patterning system. The method conducted in the flow diagram of FIG. 13 may be performed by the software application 330.

At 1300, a measurement result of a first pattern provided by, and/or a simulation result for the first pattern to be provided by, a first patterning device in a patterning system is obtained. At 1310, first error information is derived based on the measurement and/or simulation result of the first pattern. In an embodiment, the first error information comprises first patterning device registration error and/or first overlay error. In an embodiment, the first error information is derived based on measurement of physical structures produced using the patterning device in the patterning system and/or based on simulation of physical structures to be produced using the patterning device in the patterning system.

At 1320, a measurement result of a second pattern provided by, and/or a simulation result for the second pattern to be provided by, a second patterning device in the patterning system is obtained. In an embodiment, the first pattern and the second pattern are produced in the same layer of a substrate. In an embodiment, the first pattern is produced in a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

At 1330, second error information is determined based on the measurement and/or simulation results of the second pattern. In an embodiment, the second error information comprises second patterning device registration error and/or second overlay error. In an embodiment, the second error information is derived based on measurement of physical structures produced using the second patterning device in the patterning system and/or based on simulation of physical structures to be produced using the second patterning device in the patterning system At 1340, a difference between the first error information and the second error information is determined. At 1350, it is determined whether the difference between the first error information and the second error information is within a tolerance threshold. Responsive to the difference between the first error information and the second error information not crossing the tolerance threshold, the method is finished. Otherwise, the method proceeds to 1360.

At 1360, modification information for the first patterning device and/or the second patterning device is created based on the difference between the first error information and the second error information. In an embodiment, the difference between the first error information and the second error information is reduced within a certain range after the first patterning device and/or the second patterning device is modified according to the modification information. Thus, in an embodiment, the first and/or second patterning device still have a remaining error, except that difference in error between the first and second patterning devices is reduced. In an embodiment, the modification is apportioned among the first and second patterning devices.

Then, the method may return to 1300, 1320, or both depending on which patterning device(s) that the modification information is created for. This iterative modification method may continue until the difference between the first error information and the second error information is within the range.

The method conducted in the flow diagram of FIG. 13 may be performed for different use cases. In a first use case, multiple different patterning devices are used to process the same layer by the same patterning system. For example, the first use case may be for double patterning applications. Therefore, the first patterning device and the second patterning device are different patterning devices in this case. After implementing the method, error associated with the first pattern, the second pattern, or both may be reduced by correcting the first patterning device, the second patterning device, or both with the patterning device modification tool (e.g., the patterning device modification tool 320). This use case may be referred to as "intralayer fleet matching."

In a second use case, multiple copies of the same patterning device are used to process the same layer by the same patterning system. Therefore, the first patterning device and the second patterning device are different copies of the same patterning device in this case. Multiple copies of the same patterning device may be used to control, e.g., overlay error due to patterning device heating; a first copy of a patterning device may be replaced with a second copy of the patterning device. The application of the method for this second use case can enable such replacement by helping to keep the patterning process uniform. Further, this use case may applicable to replacing a first copy of the patterning device with a second copy of the patterning device responsive to the first copy of the patterning device being damaged, contaminated, etc. This use case of the method may be referred to as "intrafield fleet matching."

In a third use case, multiple different patterning devices are used to process different layers by the same patterning system. Therefore, the first patterning device and the second patterning device are different patterning devices in this case. After implementing the method, the error difference (e.g., overlay error) between the first pattern by the first patterning device and the second pattern by the second patterning device is reduced by correcting the first patterning device, the second patterning device, or both with the patterning device modification tool (e.g., the patterning device modification tool 320). This use case of the method may be referred to as "stack fleet matching."

Figure 14:
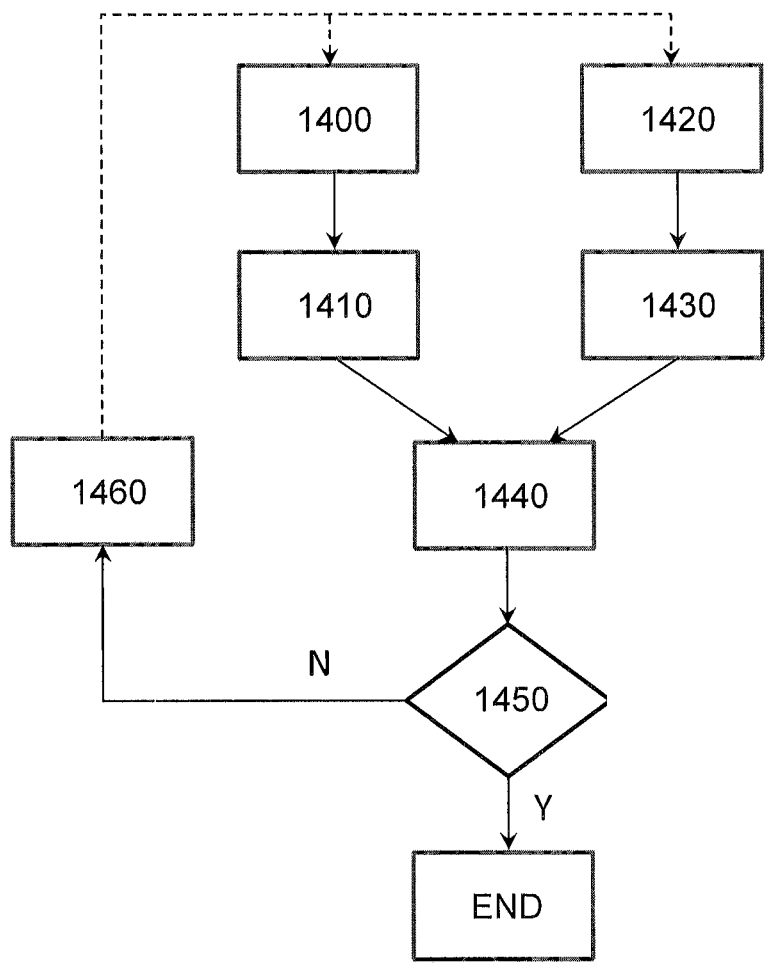
FIG. 14 schematically depicts a flow diagram of an embodiment of a method of patterning device to patterning device matching.

Referring to FIG. 14, a flow diagram of an embodiment of a method of patterning device to patterning device matching is depicted. The patterning device to patterning device matching involves qualification of the same patterning device or different patterning devices using different patterning systems. The method conducted in the flow diagram of FIG. 14 may be performed by the software application 330.

At 1400, a measurement result of a first pattern provided by, and/or a simulation result for the first pattern to be provided by, a first patterning device in a first patterning system is obtained. At 1410, first error information is determined based on the measurement and/or simulation result of the first pattern. In an embodiment, the first error information is derived based on measurement of physical structures produced using the first patterning device in the first patterning system and/or based on simulation of physical structures to be produced using the first patterning device in the first patterning system. In an embodiment, the first error information comprises first patterning device registration error and/or first overlay error.

At 1420, a measurement result of a second pattern provided by, and/or a simulation result for the second pattern to be provided by, a second patterning device in a second patterning system is obtained. In an embodiment, the first pattern and the second pattern are produced in the same layer of a substrate. In an embodiment, the first pattern is produced on a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

At 1430, second error information are determined based on the measurements or the simulation results of the second pattern. In an embodiment, the second error information is derived based on measurement of physical structures produced using the second patterning device in the second patterning system and/or based on simulation of physical structures to be produced using the second patterning device in the second patterning system. In an embodiment, the second error information comprises second patterning device registration error and/or second overlay error.

At 1440, a difference between the first error information and the second error information is determined. At 1450, it is determined whether the difference between the first error information and the second error information is within a certain tolerance range. Responsive to the difference between the first error information and the second error information being with the tolerance range, the method is finished. Otherwise, the method proceeds to 1460.

At 1460, modification information for the first patterning device and/or the second patterning device is created based on the difference between the first error information and the second error information. In an embodiment, the difference between the first error information and the second error information is reduced to within a certain range after the first patterning device and/or the second patterning device are modified according to the modification information. Thus, in an embodiment, the first and/or second patterning device still have a remaining error, except that difference in error between the first and second patterning devices is reduced. In an embodiment, the modification is apportioned among the first and second patterning devices based on the ability of the respective patterning systems to correct all or part of the difference. For example, the first patterning system may be better to handle errors of certain spatial resolution within the difference than the second patterning system.

In an embodiment, modification information for a modification apparatus of the first patterning system and/or for a modification apparatus of the second patterning system is created. In an embodiment, a co-optimization is performed to determine an optimal combination of corrections among the first and second patterning devices and the first and second patterning systems.

Then, the method may return to 1400, 1420, or both depending on which patterning device(s) that the modification information is created for. This iterative modification method may continue until the difference between the first error information and the second error information is within a certain range.

The method conducted in the flow diagram of FIG. 14 may be performed in different use cases. In a first use case, multiple different patterning devices are used to process a same layer by different patterning systems. For example, the first use case may be for double patterning applications. Therefore, the first patterning device and the second patterning device are different patterning devices in this case. After implementing the method, error associated with the first pattern, the second pattern, or both may be reduced by correcting the first patterning device, the second patterning device, or both with the patterning device modification tool (e.g., the patterning device modification tool 320). This use case may be referred to as "intralayer fleet matching."

In a second use case, multiple copies of the same patterning device are used to process a same layer on, for example, a same substrate or on different substrates, by different patterning systems. Therefore, the first patterning device and the second patterning device are different copies of the same patterning device in this case. Multiple copies of the same patterning device may be enable high volume production across multiple patterning systems. The application of the method for this second use case can enable keeping the patterning process uniform across multiple patterning systems. This use case of the method may be referred to as "intrafield fleet matching."

In a third use case, multiple different patterning devices are used to process different layers by different patterning systems. Therefore, the first patterning device and the second patterning device are different patterning devices in this case. After implementing the method, the error difference (e.g., overlay error) between the first pattern by the first patterning device and the second pattern by the second patterning device is reduced by correcting the first patterning device, the second patterning device, or both with the patterning device modification tool (e.g., the patterning device modification tool 320). In this use case, each of the patterning systems may be of a same type. This use case of the method may be referred to as "stack fleet matching."

In a fourth use case, multiple different patterning devices are used to process different layers by different patterning systems. Therefore, the first patterning device and the second patterning device are different patterning devices in this case. After implementing the method, the error difference (e.g., overlay error) between the first pattern by the first patterning device and the second pattern by the second patterning device is reduced by correcting the first patterning device, the second patterning device, or both with the patterning device modification tool (e.g., the patterning device modification tool 320). In this use case, each of the patterning systems may be of a different type. So, in an embodiment, the corrections are made to the particular patterning device depending on how the error can be best minimized between the different types of patterning system. For example, one type of patterning system may be a EUV lithography system while the other type of patterning system may be a DUV (e.g., immersion DUV) lithography system.

In an embodiment, the patterning device to patterning device matching enables patterning system to patterning system matching. That is, modification information of one or more modification apparatuses of the respective patterning systems can be included in the matching. For example, modification information of one or more modification apparatuses of one patterning system can be varied in relation to the performance of another patterning system and/or in relation to the modification information of one or more modification apparatuses of the other patterning system. Thus, a difference in performance in terms of one or more patterning process parameters (e.g., focus, dose, overlay error, etc.) can be reduced between patterning systems by an optimized combination of patterning device modification(s) and/or adjustments of one or more modification apparatuses of the patterning system(s).

In an embodiment, the patterning device to patterning device matching is performed such that patterning system related effects are removed from the analysis. In this manner, the matched patterning device may be used on different patterning systems. Thus, the patterning system specific effects can be left of out of the optimization. For example, projection system to projection system variation between optical lithographic apparatuses of different patterning system can be factored out. Similarly, grid variation between lithographic apparatuses (e.g., variation in the movement of substrate tables of the different lithographic apparatuses) can be factored out. In an embodiment, this can be done by, e.g., removing the patterning device fingerprint to identify the patterning system related effects and removing those patterning system related effects. This may involve using a reference patterning device or another copy of the same patterning device in another patterning system. In an embodiment, this can be done by using the patterning devices in the patterning systems and measuring the effects of the patterning systems.

In an embodiment, computational assessment of remaining correctable error in relation to non-correctable error, and resulting intrafield overlay when assessing successive layers, can be determined based on information of: the patterning system apparatus fingerprint and the patterning device fingerprint for a given patterning system—patterning device combination. The assessment can be made during set-up of a layer/stack, as well as during volume ramping (multiple patterning systems/patterning device copies), in order to reduce intrafield non-correctable errors. Besides setup, the analysis may also be used during production for monitoring of the patterning process (and thus control of the patterning process).

Optimal combinations of apportioning modification information to the patterning device(s) and/or modification apparatus(es) of the patterning system through matching can be done for various use cases. In one use case, multiple different patterning devices within one layer—patterning system combination per double patterning application (e.g. n*(litho-etch) ("intralayer fleet matching") can be evaluated for matching. In another use case, multiple copies of patterning devices—patterning systems within one layer for a standard single expose application ("intrafield fleet matching") can be evaluated for matching. In a further use case, multiple different patterning devices through the substrate stack where two (or more) patterning device—patterning system combinations contribute to an overlay error for standard single expose combinations on same type of patterning systems ("stack fleet matching") can be evaluated for matching. In a further use, multiple different patterning devices through the substrate stack where two (or more) patterning device—patterning system combinations contribute to an overlay error for a standard single expose combinations on different type of patterning systems (e.g., an EUV system and immersion system) ("platform fleet matching") can be evaluated for matching. In another use case, associated with platform fleet matching, the computational assessment can include determining which patterning device/patterning system fingerprint corrections can be optimally made on which type of patterning system (e.g., a certain correction on an immersion system and another correction on an EUV system). In a further use case, computational assessment can be made of optimal corrections in case of replacement of a patterning device (e.g., damaged, worn out, etc.) which belongs to a previously optimized combination of the patterning device—patterning system.

In an embodiment, the optimization can involve a cost function that accounts for, e.g., throughput/cycle time.

Figure 15:
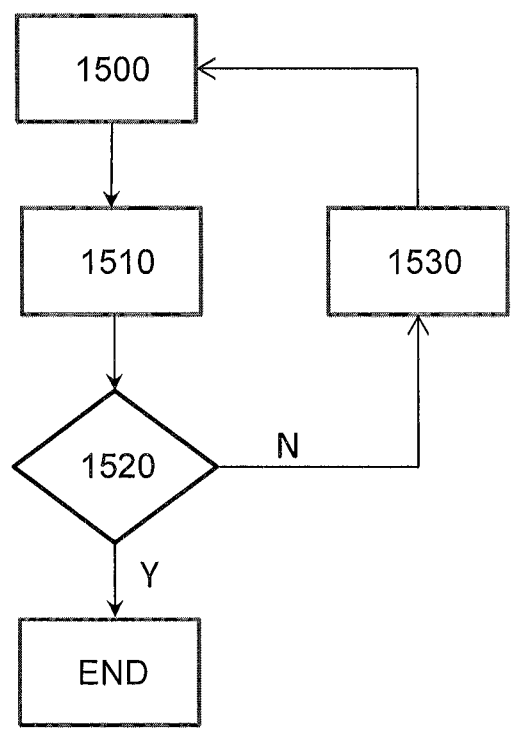
FIG. 15 schematically depicts a flow diagram of an embodiment of a method of pattern modification.

Referring to FIG. 15, a flow diagram of an embodiment of a method of pattern modification is depicted. The method conducted in the flow diagram of FIG. 15 may be performed by the software application 330. At 1500, a measurement result of a pattern provided by, and/or a simulation result for the pattern to be provided by, a patterning device in a patterning system (e.g., the patterning system 300) is obtained. In an embodiment, measurement of the pattern produced by using the patterning device in the patterning system is obtained from the metrology apparatus 310.

At 1510, an error between the pattern and a target pattern is determined. In an embodiment, the error is a critical dimension error. In an embodiment, the error is derived based on measurement of physical structures produced using the patterning device in the patterning system and/or based on simulation of physical structures to be produced using the patterning device in the patterning system.

At 1520, it is determined whether the error is within a certain tolerance range. Responsive to the error being within the tolerance range, the method is finished. Otherwise, the method proceeds to 1530.

At 1530, modification information for the patterning device is created based on the error. In an embodiment, at least some of the error is converted to a correctable error by one or more modification apparatuses of the patterning system when the patterning device is modified by a patterning device modification tool (e.g., the patterning device modification tool 320) according to the modification information. In an embodiment, additionally or alternatively, at least some of the error is reduced when the patterning device is modified by a patterning device modification tool (e.g., the patterning device modification tool 320) according to the modification information. The method then returns to 1500. Iterative modification may continue until the error is within the tolerance range.

Figure 16:
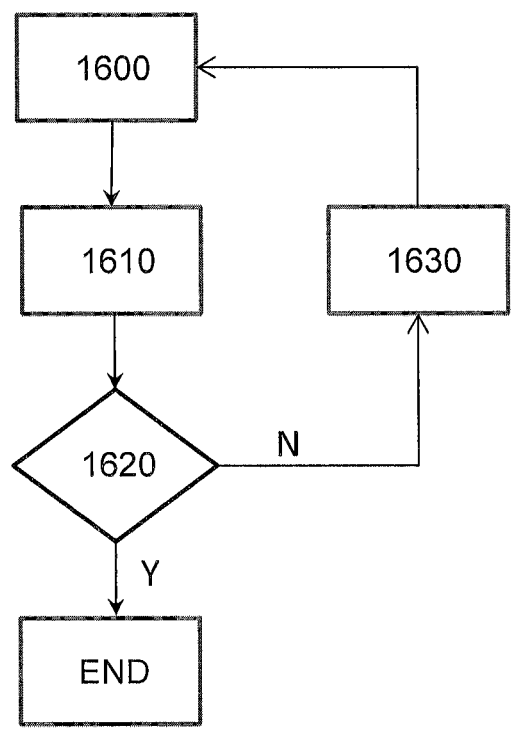
FIG. 16 schematically depicts a flow diagram of an embodiment of a method of patterning device modification to correct an etch loading effect.

Referring to FIG. 16, a flow diagram of an embodiment of a method of patterning device modification for correcting an etch-loading effect is depicted. The etch-loading effect is a factor that contributes to patterning error (e.g., overlay error). For example, etch-loading effect can have a significant impact on fabrication of 3-dimensional (3D) NAND flash memory products. The etch-loading effect indicates that the etch rate depends on the quantity of material to be etched. In other words, the etch rate vary with respect to different density of patterns on a substrate. Different etch rates may induce different patterning error (e.g., error in CD). The method conducted in the flow diagram of FIG. 16 may be performed by the software application 330.

At 1600, a measurement result of a pattern provided by, and/or a simulation result for the pattern to be provided by, a patterning device in a patterning system (e.g., the patterning system 300) is obtained. In an embodiment, the measurement or simulation result is of the pattern after processing by an etch tool of the patterning system. In an embodiment, the measurement of the pattern after the etch tool is obtained from the metrology apparatus 310. In an embodiment, the measurement or simulation result comprises measurement or simulation information of the pattern before processing by an etch tool of the patterning system to, for example, enable identification of the etch-loading effect and/or to account for error introduced upstream of the etch tool.

At 1610, patterning error information based on the measurement and/or simulation result is determined. In an embodiment, the patterning error information comprises an error due to the etch loading effect.

At 1620, it is determined whether the patterning error information is within a certain tolerance range. Responsive to the patterning error information being within the tolerance range, the method is finished. Otherwise, the method proceeds to 1630.

At 1630, modification information for modifying a patterning device and/or for adjusting a modification apparatus upstream in the patterning system from the etch tool is created based on the patterning error. In an embodiment, at least some of the error is converted to a correctable error by one or more modification apparatuses of the patterning system when the patterning device is modified by a patterning device modification tool (e.g., the patterning device modification tool 320) according to the patterning device modification information and/or when the modification apparatus of the patterning system is adjusted by the modification apparatus modification information. In an embodiment, additionally or alternatively, at least some of the error is reduced when the patterning device is modified by a patterning device modification tool (e.g., the patterning device modification tool 320) according to the patterning device modification information and/or when the modification apparatus of the patterning system is adjusted by the modification apparatus modification information. In an embodiment, modification information for modifying the patterning device and modification information for adjusting the modification apparatus is co-optimized to enable, for example, maximum correction by the modification apparatus of the portion of patterning error correctable by the modification apparatus and correction of residual error by the patterning device modification.

The method then returns to 1600. Iterative modification can continues until the patterning error is within the tolerance range.

As discussed above, a patterning system may experience error and some of the error may not be correctable (typically due to the spatial resolution of the error) by one or more modification apparatuses of the patterning system. As described above, in an embodiment, the error that is not correctable by one or modification apparatus may be at least partially corrected by one or more other modification apparatuses (e.g., that has higher spatial resolution for error correction) and/or by a modification (e.g., a high spatial resolution correction) of a patterning device. To enable this error correction, measurement results may be used to determine the error (including, for example, its spatial distribution). The metrology apparatus 310 (e.g., metrology system MET) may enable such measurements and determine error information, such as overlay error, dose, focus, critical dimension, etc.

To make use of such measurements and to enable creation of the modification information, as discussed above, one or more mathematical models may be used. In an embodiment, the software application 330 enables the modeling and the use of the modeling to arrive at modification information.

In an embodiment, an error mathematical model is provided to model patterning error information (e.g., a fingerprint) of a patterning process using a patterning device in a patterning system. In an embodiment, the error mathematical model models patterning error information of patterning error information of substrates patterned in the patterning process using the patterning device in the patterning system. In an embodiment, the error mathematical model is tuned to one or more types of high resolution error. Examples of types of high resolution error include errors due to an etch-loading effect, errors due to projection system heating (e.g., from projection radiation), errors due to patterning device heating (e.g., from illumination radiation), errors due to substrate heating (e.g., from projected radiation), errors arising from illumination aberration sensitivity (e.g., of the projection system of a lithographic apparatus), errors in patterning system to patterning system matching (e.g., lithographic apparatus to lithographic apparatus matching), and errors in patterning device to patterning device matching.

In an embodiment, a correction mathematical model is provided to model a correction of the patterning error that can be made by one or more modification apparatuses of the patterning system and/or by a patterning device modification tool (e.g., patterning device modification tool 320, such as the tool described with respect to FIG. 4). In an embodiment, there is provided a correction mathematical model to model a correction of the patterning error that can be made by one or more modification apparatuses of the patterning system. In an embodiment, there is provided a correction mathematical model to model a correction of the patterning error that can be made by a patterning device modification tool (e.g., patterning device modification tool 320, such as the tool described with respect to FIG. 4). In an embodiment, the correction mathematical model for the patterning device modification tool has a higher resolution than the correction mathematical model for the one or more modifying apparatuses. In an embodiment, the error mathematical model has a resolution the same as or comparable to the correction mathematical model for the patterning device modification tool. In an embodiment, high resolution comprises spatial frequencies on the substrate of 1 mm or less.

Thus, in an embodiment, modification information for one or more modifying apparatuses and/or a patterning device modification tool can be obtained by applying one or more applicable correction mathematical models to the patterning error modeled by the error mathematical model.

In an embodiment, to parameterize the error mathematical model, the metrology apparatus 310 measures and determines patterning error information. In an embodiment, patterning error information comprises overlay error, focus, dose and/or critical dimension. To make the measurements, the metrology apparatus 310 may use one or more metrology targets (e.g., diffraction periodic structures, such as gratings, or structures of a device pattern itself) on substrates. Desirably, the one or more metrology targets accurately represent the patterning error and a sufficient amount and location of metrology targets are measured to properly characterize the patterning error across a substrate.

Accordingly, in an embodiment, the software application 330 is configured to identify one or more metrology targets for measurement and develop a metrology recipe for the one or more metrology targets. A metrology recipe is one or more parameters (and one or more associated values) associated with the metrology apparatus 310 itself used to measure the one or more metrology targets and/or the measurement process, such as one or more wavelengths of the measurement beam, one or more types of polarization of the measurement beam, one or more dose values of the measurement beam, one or more bandwidths of the measurement beam, one or more aperture settings of the inspection apparatus used with the measurement beam, the alignment marks used to locate the measurement beam on the target, the alignment scheme used, the sampling scheme, the layout of the metrology targets and the movement scheme to measure the targets and/or points of interest of a target, etc. In an embodiment, the metrology recipe is selected based on the error mathematical model.

In an embodiment, the one or more metrology targets may be designed and qualified for the patterning process. For example, a plurality of metrology target designs may be evaluated to identify the one or more metrology targets that minimize residual variation (systematic and/or random). In an embodiment, a plurality of metrology target designs may be evaluated to identify the one or more metrology targets whose performance match the device, e.g., identify a metrology target whose measure of overlay error matches the overlay error of the device. The metrology target may be designed, e.g., for measurement of overlay, of focus, of critical dimension (CD), of alignment, of asymmetry in the target, etc. or any combination selected therefrom.

In an embodiment, the metrology apparatus 310 may apply one or more sampling schemes for a metrology process. In an embodiment, a sampling scheme may include one or more parameters selected from: number of sample points per substrate, number of substrates per lot sampled; numeric designation of the substrate(s) in a lot or per lot sampled; number of fields sampled; layout/locations of sampled fields on the substrate; number of sites in each field; locations of the sites in the field; frequency of samples; type of metrology target; or measurement algorithm.

In an embodiment, the software application 330 may use a sample scheme optimizer module to further determine one or more aspects (e.g., layout of the sampled locations/targets) for a combination of error mathematical model and number of sample points (e.g., number of substrates sampled and/or number of points per substrate sampled). For example, the sample scheme optimizer may take into account various constraints or limitations, such as selecting sampling locations at a minimized distance from the edge of the substrate to avoid non-yielding dies.

In an embodiment, the sample scheme optimizer may determine a sampling scheme for measuring data with a metrology target using a metrology recipe at least partially based on a through-put model of the metrology apparatus 310. In an embodiment, the sampling scheme may be further based on an error mathematical model. The sample scheme optimizer may further determine (e.g., calculate itself) an evaluation parameter based on the measurement data and the sampling scheme. For example, the evaluation parameter may comprise substrate-to-substrate variation within a lot of substrates, remaining uncertainty, remaining systematic variation, etc. The sample scheme optimizer may then determine if the evaluation parameter crosses a threshold. And, if the evaluation parameter is determined to cross the threshold, the sample scheme optimizer may change the sampling scheme at least partially based on the through-put model (e.g., modify the sampling scheme such that the sampling scheme will still meet one or more criteria of the through-put model). The sample scheme optimizer may further, if the sampling scheme has been changed, re-perform at least the determining the evaluation parameter based on the measurement data and the changed sampling scheme and the determining if the evaluation parameter determined based on the measurement data and the changed sampling scheme crosses a threshold.

Fitting data using higher order basis functions typically results in increasing sensitivity to noise. On the other hand, with increasing order basis functions, the residuals will decrease. So, the sample scheme optimizer may account for this in arriving at sample scheme to match the model by balancing through a cost function that considers higher orders that reduce residuals but controls sampling to keep sensitivity to noise low. For example, the sample scheme influences the reduction of the input noise, the number of substrates that can be measured per lot influences the reduction of the noise, and/or the lot sampling influences the output noise. So, as part of the optimization, various different sample scheme variants can be used. For example, the number of substrates per lot measured may be reduced and/or the number of sampled locations per substrate may be reduced. As a further example, more measurement points may be selected near the borders of fields and/or the substrate because the basis functions may "behave" the "wildest" there and so more information is desired there.

In an embodiment, the sample scheme optimizer selects an optimal subset of measurement locations from a set of potential measurement locations. So, input to the sample scheme optimizer may be one or more mathematical models that can represent the patterning error (e.g., the fingerprint) in the measured data and a measurement layout from which the sampling scheme may be determined (e.g., all the locations that can be measured on a substrate, e.g., where measurement targets can be or are located). From this input, the sample scheme optimizer can evaluate the one or more models and the measurement layout to arrive at one or more sampling schemes involving a subset of measurement locations (e.g., number and/or specific locations of measurements) based on a cost function. The cost function may involve reducing remaining uncertainty, obtaining uniform distribution of measurement locations, reducing clustering of measurement locations, reducing lot-to-lot variation, reducing substrate-to-substrate variation and/or obtaining fast execution time. In an embodiment, the user may further impose a constraint, e.g., number of points to be measured, excluded certain fields or intra-field points, a parameter representing the distribution of the points (e.g., more points toward the center or more points toward the edge), etc. In an embodiment, the sample scheme optimizer may impose a constraint, such as an exclusion of measurement points from non-yielding dies. Further, the sample scheme optimizer may constrain the evaluation using the through-put model, such that the one or more sample schemes meet criteria of the through-put model. The output of the sample scheme optimizer is one or more sample schemes. In an embodiment, the sample scheme optimizer may provide a graphical user interface to enable the inputs and constraints. Further, the graphical user interface may present a graphical representation of the sample scheme (e.g., a diagram or picture of a substrate with the number of measurement locations graphically depicted along with their locations). The graphical user interface can also present performance information regarding the sampling scheme such as remaining uncertainty (e.g., for different directions).

Thus, the sample scheme optimizer can optimize between a sparse sampling scheme and a dense sampling scheme based on the mathematical model, the available layout and the through-put model. The sparse sampling may have the lowest possible remaining uncertainty (and thus robust capture of the mathematical model) but may have poor coverage of the substrate and poor robustness for mismatch between the model and the fingerprint. On the other hand, the dense sampling may have large or widely varying remaining uncertainty but may have good coverage of the substrate, avoid clustering, and have good robustness for mismatch between the model and the fingerprint.

In an embodiment, as noted above, a user may specify a constraint on the sampling scheme, for example, a maximum number of samples per substrate, a maximum number of substrates per lot sampled, etc. For example, an interface (such as a graphical user interface) may allow the user to specify the constraint. In an embodiment, a user may specify one or more sampling schemes to be evaluated. For example, an interface (such as a graphical user interface) may present to a user a number of sampling schemes for selection of one or more, or all, of the sampling schemes and/or allow a user to add a sampling scheme for consideration.

In an embodiment, where a new or modified device pattern (and thus new measurement data) is used for an otherwise same patterning process and same layer, then one or more previously determined models (but parameterized for the new measurement data) and sampling schemes may be used; thus, it may not be necessary to newly determine one or more mathematical models or newly determine one or more sampling schemes.

In an embodiment, a sample scheme optimizer selects metrology point locations which are most informative to the model fitting process, given a certain model. At the same time the sampling scheme optimization algorithm attempts to position selected metrology point locations in a uniform way, such that the two objectives are balanced. In an embodiment, the sampling scheme optimization is input with a list of potential metrology point locations. Then, a sampling scheme is initialized by selecting a small number of initial selected metrology point locations. The initial selected metrology point locations should be selected according to one or more criteria in accordance with the model. In an embodiment, each of these selected metrology point locations may be selected metrology point locations positioned at the edge of the effective area of a substrate, and separated equi-angularly. The initialization step may also include defining an exclusion zone around each selected metrology point location. All metrology point locations which are outside the exclusion zones are candidate metrology point locations; i.e. "selectable" in future iterations. The exclusion zones may be circular and centered on each selected metrology point location, i.e., all metrology point locations within a certain distance of a selected metrology point location may be within an exclusion zone. Then, all candidate metrology point locations, that is all non-selected metrology point locations which are not within an exclusion zone, are evaluated. For each candidate metrology point location, it is calculated how much the informativity of the sampling scheme would improve if that metrology point location were selected. A criterion used in the evaluation may be D-optimality. The size of the initial exclusion zones should have been chosen to ensure that the initial set of candidate metrology point locations is not too large. The number of candidate metrology point locations should be a compromise between uniformity, informativity (e.g. D-optimality) of the final sampling scheme, and speed of the algorithm. After evaluating all candidate metrology point locations, the metrology point location which, according to the evaluation, contributes the most information to the sampling scheme is then added to the sampling scheme. It is determined whether the sampling scheme comprises sufficient selected metrology point locations. If it does, the sampling scheme is ready. If the sampling scheme does not have sufficient selected metrology point locations then an exclusion zone is added around the newly selected metrology point location (the other selected metrology point locations will also have exclusion zones). Then, it is determined whether there are a sufficient number of candidate metrology point locations remaining to select from, while maintaining the proper balance between informativity and uniformity. In an embodiment, if it is determined that there are too few candidate metrology point locations, this may be addressed by shrinking the exclusion zones. The exclusion zones may be shrunk for all of the selected metrology point locations comprised in the sampling scheme at that time, or for only a subset of these selected metrology point locations. Then, the determination of whether there are a sufficient number of candidate metrology point locations remaining to select from and (if necessary) the shrinking are repeated iteratively until there are a sufficient number of candidate metrology point locations from which to complete the sampling scheme. When there are a sufficient number of candidate metrology point locations, the candidate metrology point location evaluation and subsequent steps, are repeated. In an embodiment, the optimization may determine different sampling schemes for different substrates. Further, different sampling schemes of different substrates may be connected such that the selected metrology point locations are distributed with a high degree of uniformity over a plurality of substrates: for example per lot of substrates. In particular, a sampling scheme optimization method may be such that a metrology point location which has been selected for a previous sampling scheme (for a previous substrate) is not selected for a subsequent sampling scheme (for a subsequent substrate) within a lot. In this way each selected metrology point location for the lot of substrates is unique. In an embodiment, the optimization helps ensure that, for each individual substrate, the normalized model uncertainty is minimized: all parameter values can be determined with improved precision. It does this by minimizing the impact that variations in the measurements have on variations in the model predictions.

In an embodiment, there is provided a method comprising: identifying that an area of a first substrate comprises a hotspot based on a measurement and/or simulation result pertaining to a patterning device in a patterning system; determining first error information at the hotspot; and creating, by a computer system, first modification information for modifying the patterning device based on the first error information to obtain a modified patterning device.

In an embodiment, the method further comprises obtaining the measurement result for a first pattern provided to, and/or a simulation result for a first pattern to be provided to, the area of the first substrate, the first pattern provided, or to be provided, by using the patterning device in the patterning system. In an embodiment, the first error information is derived based on measurement of physical structures produced using the patterning device in the patterning system and/or based on simulation of physical structures to be produced using the patterning device in the patterning system. In an embodiment, the first error comprises first correctable error for the patterning system. In an embodiment, the first error comprises first non-correctable error for the patterning system. In an embodiment, the first error information comprises one or more selected from: critical dimension information, overlay error information, focus information, and/or dose information. In an embodiment, the method further comprises: obtaining a measurement and/or simulation result for a second pattern provided or to be provided on an area of a second substrate by using the modified patterning device in the patterning system; and determining whether the area of the second substrate comprises a hotspot based on the measurement and/or simulation result of the second pattern. In an embodiment, the method further comprises: determining second error information at the area of the second substrate based on the second pattern responsive to the area of the second substrate comprising a hotspot; and creating second modification information for modifying the modified patterning device based on the second error information. In an embodiment, the second error information is derived based on measurement of physical structures produced using the modified patterning device in the patterning system and/or based on simulation of physical structures to be produced using the modified patterning device in the patterning system. In an embodiment, the second error comprises second correctable error for the patterning system. In an embodiment, the second error comprises second non-correctable error for the patterning system. In an embodiment, the second error information comprises one or more selected from: critical dimension information, overlay error information, focus information, and/or dose information.

In an embodiment, there is provided a system comprising: a hardware processor system; and a non-transitory computer readable storage medium storing machine-readable instructions, wherein when executed, the machine-readable instructions cause the processor system to: identify that an area of a first substrate comprises a hotspot based on a measurement and/or simulation result pertaining to a patterning device in a patterning system; determine first error information at the hotspot; and create first modification information for modifying the patterning device based on the first error information to obtain a modified patterning device.

In an embodiment, when executed, the machine-readable instructions further cause the processor system to obtain the measurement result for a first pattern provided to, and/or a simulation result for a first pattern to be provided to, the area of the first substrate, the first pattern provided, or to be provided, by using the patterning device in the patterning system. In an embodiment, the first error information is derived based on measurement of physical structures produced using the patterning device in the patterning system and/or based on simulation of physical structures to be produced using the patterning device in the patterning system. In an embodiment, the first error comprises first correctable error for the patterning system. In an embodiment, the first error comprises first non-correctable error for the patterning system. In an embodiment, the first error information comprises one or more selected from: critical dimension information, overlay error information, focus information, and/or dose information. In an embodiment, when executed, the machine-readable instructions further cause the processor system to: obtain a measurement and/or simulation result for a second pattern provided or to be provided on an area of a second substrate by using the modified patterning device in the patterning system; and determine whether the area of the second substrate comprises a hotspot based on the measurement and/or simulation result of the second pattern. In an embodiment, when executed, the machine-readable instructions further cause the processor system to: determine second error information at the area of the second substrate responsive to the area of the second substrate comprising the hotspot; and create second modification information for modifying the modified patterning device based on the second error information. In an embodiment, the second error information is derived based on measurement of physical structures produced using the modified patterning device in the patterning system and/or based on simulation of physical structures to be produced using the modified patterning device in the patterning system. In an embodiment, the second error comprises second correctable error for the patterning system. In an embodiment, the second error comprises second non-correctable error for the patterning system. In an embodiment, the second error information comprises one or more selected from: critical dimension information, overlay error information, focus information, and/or dose information.

In an embodiment, there is provided a method comprising: obtaining patterning error information for a patterning process involving a patterning device; and determining, by a computer system, a patterning error offset for a modification apparatus of the patterning process based on the patterning error information and information about the modification apparatus, wherein combination of the patterning error offset and the patterning error is modifiable within a modification range of the modification apparatus.

In an embodiment, obtaining the patterning error information comprises obtaining the patterning error information by measurement and/or by simulation. In an embodiment, the patterning error is time-varying and a correction of the patterning error by the modification apparatus without the pattern error offset does, or would, fall outside the modification range. In an embodiment, the method further comprises creating first modification information for the patterning device based on the patterning error offset, wherein at least a portion of the patterning error offset is combined with the patterning error when the patterning device is used in the patterning process after modification according to the first modification information. In an embodiment, the method further comprises creating second modification information for a manufacturing processing tool used in the patterning process based on the patterning error offset, wherein at least a portion of the patterning error offset is combined with the patterning error when the manufacturing processing tool is used after modification according to the second modification information. In an embodiment, the manufacturing processing tool comprises a track tool, a deposition tool, a planarization tool and/or an etch tool.

In an embodiment, there is provide a method comprising: obtaining a measurement and/or simulation result of a pattern after being processed by an etch tool of a patterning system; determining a patterning error due to an etch loading effect based on the measurement and/or simulation result; and creating, by a computer system, modification information for modifying a patterning device and/or for adjusting a modification apparatus upstream in the patterning system from the etch tool based on the patterning error, wherein the patterning error is converted to a correctable error and/or reduced to a certain range, when the patterning device is modified according to the modification information and/or the modification apparatus is adjusted according to the modification information.

In an embodiment, the method comprises creating the modification information for the patterning device. In an embodiment, the method comprises creating the modification information for the modification apparatus upstream in the patterning system from the etch tool. In an embodiment, the method further comprises co-optimizing modification information for modifying the patterning device and modification information for adjusting the modification apparatus.

In an embodiment, there is provided a method comprising: obtaining information regarding an error in addition to, or other than, a patterning device registration error, wherein a portion of the error is not correctable by a modification apparatus of a patterning system; and creating, by a computer system, modification information for modifying a patterning device based on the error information, the modification information transforming the portion of the error to correctable error for the modification apparatus when the patterning device is modified according to the modification information.

In an embodiment, the creating modification information further comprises creating the modification information based on a modification range of the modification apparatus. In an embodiment, the method further comprises creating modification information for the modification apparatus of the patterning system based on the error information and modification information for modifying the patterning device, wherein modification information for the modification apparatus includes information regarding the correctable error produced by the modified patterning device. In an embodiment, the method further comprises co-optimizing modification information for modifying the patterning device and modification information for adjusting the modification apparatus. In an embodiment, the patterning error information is derived based on measurement and/or simulation. In an embodiment, the patterning error information comprises one or more selected from: critical dimension information, overlay error information, focus information, and/or dose information. In an embodiment, transforming the portion of the patterning error to the correctable error for the patterning system comprises creating an induced local density and/or transmission variation within a substrate of the patterning device. In an embodiment, creating the induced local density variation comprises creating the induced local density and/or transmission variation by using laser pulses to change a material property of the substrate.

In an embodiment, there is provided a system comprising: a hardware processor system; and a non-transitory computer readable storage medium storing machine-readable instructions, wherein when executed, the machine-readable instructions cause the processor system to: obtain patterning error information for a patterning process involving a patterning device; and determine a patterning error offset for a modification apparatus of the patterning process based on the patterning error information and information about the modification apparatus, wherein combination of the patterning error offset and the patterning error is modifiable within a modification range of the modification apparatus.

In an embodiment, when executed, the machine-readable instructions further cause the processor system to obtain the patterning error information from measurement and/or by simulation. In an embodiment, the patterning error is time-varying and a correction of the patterning error by the modification apparatus without the pattern error offset does, or would, fall outside the modification range. In an embodiment, when executed, the machine-readable instructions further cause the processor system to create first modification information for the patterning device based on the patterning error offset, wherein at least a portion of the patterning error offset is combined with the patterning error when the patterning device is used in the patterning process after modification according to the first modification information. In an embodiment, when executed, the machine-readable instructions cause the processor system to create second modification information for a manufacturing processing tool used in the patterning process based on the patterning error offset, wherein at least a portion of the patterning error offset is combined with the patterning error when the manufacturing processing tool is used after modification according to the second modification information. In an embodiment, the manufacturing processing tool comprises a track tool, a deposition tool, a planarization tool and/or an etch tool.

In an embodiment, there is provided a system comprising: a hardware processor system; and a non-transitory computer readable storage medium storing machine-readable instructions, wherein when executed, the machine-readable instructions cause the processor system to: obtain a measurement and/or simulation result of a pattern after being processed by an etch tool of a patterning system; determine a patterning error due to an etch loading effect based on the measurement and/or simulation result; and create modification information for modifying a patterning device and/or for adjusting a modification apparatus upstream in the patterning system from the etch tool based on the patterning error, wherein the patterning error is converted to a correctable error and/or reduced to a certain range, when the patterning device is modified according to the modification information and/or the modification apparatus is adjusted according to the modification information.

In an embodiment, when executed, the machine-readable instructions cause the processor system to create the modification information for the patterning device. In an embodiment, when executed, the machine-readable instructions cause the processor system to create the modification information for the modification apparatus upstream in the patterning system from the etch tool. In an embodiment, when executed, the machine-readable instructions cause the processor system to co-optimize modification information for modifying the patterning device and modification information for adjusting the modification apparatus.

In an embodiment, there is provided a system comprising: a hardware processor system; and a non-transitory computer readable storage medium storing machine-readable instructions, wherein when executed, the machine-readable instructions cause the processor system to: obtain information regarding an error in addition to, or other than, a patterning device registration error, wherein a portion of the error is not correctable by a modification apparatus of a patterning system; and create modification information for modifying a patterning device based on the error information, the modification information transforming the portion of the error to correctable error for the modification apparatus when the patterning device is modified according to the modification information.

In an embodiment, the machine-readable instructions that cause the processor system to create modification information further cause the processor system to create the modification information based on a modification range of the modification apparatus. In an embodiment, when executed, the machine-readable instructions cause the processor system to create modification information for the modification apparatus of the patterning system based on the error information and modification information for modifying the patterning device, wherein modification information for the modification apparatus includes information regarding the correctable error produced by the modified patterning device. In an embodiment, when executed, the machine-readable instructions cause the processor system to co-optimize modification information for modifying the patterning device and modification information for adjusting the modification apparatus. In an embodiment, the patterning error information is derived based on measurement and/or simulation. In an embodiment, the patterning error information comprises one or more selected from: critical dimension information, overlay error information, focus information, and/or dose information. In an embodiment, when executed, the machine-readable instructions cause the processor system to cause creation of an induced local density and/or transmission variation within a substrate of the patterning device to enable the transforming the portion of the patterning error to the correctable error for the patterning system. In an embodiment, the machine-readable instructions that cause the processor system to cause creation of the induced local density variation further cause the processor system to cause creation of the induced local density and/or transmission variation by using laser pulses to change a material property of the substrate.

In an embodiment, there is provided a method comprising: obtaining a measurement result of a pattern provided to, and/or a simulation result for the pattern to be provided to, an area of a substrate, the pattern provided, or to be provided, by using a patterning device in a patterning system; determining an error between the pattern and a target pattern; and creating, by a computer system, modification information for the patterning device based on the error, wherein the error is converted to a correctable error and/or reduced to a certain range, when the patterning device is modified according to the modification information.

In an embodiment, the error is a critical dimension error. In an embodiment, the error is derived based on measurement of physical structures produced using the patterning device in the patterning system and/or based on simulation of physical structures to be produced using the patterning device in the patterning system.

In an embodiment, there is provided a system comprising: a hardware processor system; and a non-transitory computer readable storage medium storing machine-readable instructions, wherein when executed, the machine-readable instructions cause the processor system to: obtain a measurement result of a pattern provided to, and/or a simulation result for the pattern to be provided to, an area of a substrate, the pattern provided, or to be provided, by using a patterning device in a patterning system; determine an error between the pattern and a target pattern; and create modification information for the patterning device based on the error, wherein the error is converted to a correctable error and/or reduced to a certain range, when the patterning device is modified according to the modification information.

In an embodiment, the error is a critical dimension error. In an embodiment, the error is derived based on measurement of physical structures produced using the patterning device in the patterning system and/or based on simulation of physical structures to be produced using the patterning device in the patterning system.

In an embodiment, there is provided a method comprising: obtaining information describing a modification made or to be made by a pattern modification tool to a patterning device for a patterning process; obtaining a spatial distribution of temperature and/or deformation of the patterning device; and predicting, by a computer system, cracking behavior of the patterning device based on the modification information of the patterning device and the spatial distribution of temperature and/or deformation of the patterning device.

In an embodiment, predicting the cracking behavior further comprises: determining a stress or strain map of the patterning device based on the modification information of the patterning device and the spatial distribution of temperature and/or deformation of the patterning device; and deriving a measure of cracking based on the stress or strain map of the patterning device, wherein the patterning device is predicted to crack responsive to the measure of cracking passes a patterning device crack threshold. In an embodiment, the method further comprises co-optimizing an adjustment of the patterning process by a modification apparatus in a patterning system used in the patterning process and a modification of the patterning device to be made by the patterning device modification tool. In an embodiment, the method further comprises creating first modification information based on the co-optimization, wherein the first modification information instructs the patterning device modification tool to implement the modification of the patterning device. In an embodiment, the method further comprises creating second modification information based on the co-optimization, wherein the second modification information instructs the modification apparatus in the patterning system to implement the adjustment. In an embodiment, the modification made or to be made by a pattern modification tool comprises an induced local density variation in a substrate of the patterning device.

In an embodiment, there is provided a method comprising: obtaining a spatial distribution of temperature and/or deformation of a patterning device for use in a patterning system; obtaining, by a computer system, a prediction on cracking behavior of the patterning device based on the spatial distribution of temperature and/or deformation of the patterning device; and preventing use of the patterning device in the patterning system responsive to the prediction indicating the patterning device has cracked or is going to crack.

In an embodiment, the patterning device has been modified by a patterning device modification tool. In an embodiment, obtaining the spatial distribution of temperature and/or deformation comprises measuring temperature and/or deformation at a plurality of locations on or near a surface of the patterning device. In an embodiment, the method further comprises comprising sending the patterning device to a patterning device modification tool for modification after preventing use of the patterning device in the patterning system.

In an embodiment, there is provided a system comprising: a hardware processor system; and a non-transitory computer readable storage medium storing machine-readable instructions, wherein when executed, the machine-readable instructions cause the processor system to: obtain information describing a modification made or to be made by a pattern modification tool to a patterning device for a patterning process; obtain a spatial distribution of temperature and/or deformation of the patterning device; and predict cracking behavior of the patterning device based on the modification information of the patterning device and the spatial distribution of temperature and/or deformation of the patterning device.

In an embodiment, the instructions to cause the processor system to predict the cracking behavior further cause the processor system to: determine a stress or strain map of the patterning device based on the modification information of the patterning device and the spatial distribution of temperature and/or deformation of the patterning device; and derive a measure of cracking based on the stress or strain map of the patterning device, wherein the patterning device is predicted to crack responsive to the measure of cracking passing a patterning device crack threshold. In an embodiment, when executed, the machine-readable instructions further cause the processor system to co-optimize an adjustment of the patterning process by a modification apparatus in a patterning system used in the patterning process and a modification of the patterning device to be made by the patterning device modification tool. In an embodiment, when executed, the machine-readable instructions further cause the processor system to create first modification information based on the co-optimization, wherein the first modification information instructs the patterning device modification tool to implement the modification of the patterning device. In an embodiment, when executed, the machine-readable instructions further cause the processor system to create second modification information based on the co-optimization, wherein the second modification information instructs the modification apparatus in the patterning system to implement the adjustment. In an embodiment, the modification made or to be made by a pattern modification tool comprises an induced local density variation in a substrate of the patterning device.

In an embodiment, there is provided a system comprising: a hardware processor system; and a non-transitory computer readable storage medium storing machine-readable instructions, wherein when executed, the machine-readable instructions cause the processor system to: obtain a spatial distribution of temperature and/or deformation of a patterning device for use in a patterning system; obtain a prediction on cracking behavior of the patterning device based on the spatial distribution of temperature and/or deformation of the patterning device; and prevent use of the patterning device in the patterning system responsive to the prediction indicating the patterning device has cracked or is going to crack.

In an embodiment, the patterning device has been modified by a patterning device modification tool. In an embodiment, the system further comprises a temperature and/or deformation sensor and wherein the instructions to cause the processor system to obtain the spatial distribution of temperature and/or deformation further cause the processor system to measure temperature using the temperature sensor at a plurality of locations on or near a surface of the patterning device and/or to measure deformation using the deformation sensor at a plurality of locations on or near a surface of the patterning device. In an embodiment, when executed, the machine-readable instructions further cause the processor system to send the patterning device to a patterning device modification tool for modification after prevention of use of the patterning device in the patterning system.

In an embodiment, there is provided a method comprising: determining first error information based on a first measurement and/or simulation result pertaining to a first patterning device in a patterning system; determining second error information based on a second measurement and/or simulation result pertaining to a second patterning device in the patterning system; determining a difference between the first error information and the second error information; and creating, by a computer system, modification information for the first patterning device and/or the second patterning device based on the difference between the first error information and the second error information, wherein the difference between the first error information and the second error information is reduced to within a certain range after the first patterning device and/or the second patterning device is modified according to the modification information.

In an embodiment, the method further comprises obtaining the first measurement result of a first pattern provided by, and/or the first simulation result for a first pattern to be provided by, the first patterning device in the patterning system and obtaining the second measurement result of a second pattern provided by, and/or the second simulation result for a second pattern to be provided by, the second patterning device in the patterning system. In an embodiment, the first error information is derived based on measurement of physical structures produced using the patterning device in the patterning system and/or based on simulation of physical structures to be produced using the patterning device in the patterning system. In an embodiment, the first error information comprises first patterning device registration error and/or first overlay error. In an embodiment, the second error information is derived based on measurement of physical structures produced using the second patterning device in the patterning system and/or based on simulation of physical structures to be produced using the second patterning device in the patterning system. In an embodiment, the second error information comprises second patterning device registration error and/or second overlay error. In an embodiment, the first pattern and the second pattern are produced in the same layer of a substrate. In an embodiment, the first pattern is produced on a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

In an embodiment, there is provided a system comprising: a hardware processor system; and a non-transitory computer readable storage medium storing machine-readable instructions, wherein when executed, the machine-readable instructions cause the processor system to: determine first error information based on a first measurement and/or simulation result pertaining to a first patterning device in a patterning system; determine second error information based on a second measurement and/or simulation result pertaining to a second patterning device in the patterning system; determine a difference between the first error information and the second error information; and create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

In an embodiment, when executed, the machine-readable instructions further cause the processor system to cause obtaining of the first measurement result of a first pattern provided by, and/or the first simulation result for a first pattern to be provided by, the first patterning device in the patterning system and obtaining of the second measurement result of a second pattern provided by, and/or the second simulation result for a second pattern to be provided by, the second patterning device in the patterning system. In an embodiment, the first error information is derived based on measurement of physical structures produced using the first patterning device in the patterning system and/or based on simulation of physical structures to be produced using the first patterning device in the patterning system. In an embodiment, the first error information comprises first patterning device registration error and/or first overlay error. In an embodiment, the second error information is derived based on measurement of physical structures produced using the second patterning device in the patterning system and/or based on simulation of physical structures to be produced using the second patterning device in the patterning system. In an embodiment, the second error information comprises second patterning device registration error and/or second overlay error. In an embodiment, the first pattern and the second pattern are produced in the same layer of a substrate. In an embodiment, the first pattern is produced on a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

In an embodiment, there is provided a method comprising: determining first error information based on a first measurement and/or simulation result pertaining to a first patterning device in a first patterning system; determining second error information based on a second measurement and/or simulation result pertaining to a second patterning device in a second patterning system; determining a difference between the first error information and the second error information; and creating, by a computer system, modification information for the first patterning device and/or the second patterning device based on the difference between the first error information and the second error information, wherein the difference between the first error information and the second error information is reduced within a certain range after the first patterning device and/or the second patterning device is modified according to the modification information.

In an embodiment, the method further comprises obtaining the first measurement result of a first pattern provided by, and/or the first simulation result for a first pattern to be provided by, the first patterning device in the first patterning system and obtaining the second measurement result of a second pattern provided by, and/or the second simulation result for a second pattern to be provided by, the second patterning device in the second patterning system. In an embodiment, the first error information is derived based on measurement of physical structures produced using the first patterning device in the first patterning system and/or based on simulation of physical structures to be produced using the first patterning device in the first patterning system. In an embodiment, the first error information comprises first patterning device registration error and/or first overlay error. In an embodiment, the second error information is derived based on measurement of physical structures produced using the second patterning device in the second patterning system and/or based on simulation of physical structures to be produced using the second patterning device in the second patterning system. In an embodiment, the second error information comprises second patterning device registration error and/or second overlay error. In an embodiment, the first pattern and the second pattern are produced in the same layer of a substrate. In an embodiment, the first pattern is produced on a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

In an embodiment, there is provided a system comprising: a hardware processor system; and a non-transitory computer readable storage medium storing machine-readable instructions, wherein when executed, the machine-readable instructions cause the processor system to: determine first error information based on a first measurement and/or simulation result pertaining to a first patterning device in a first patterning system; determine second error information based on a second measurement and/or simulation result pertaining to a second patterning device in a second patterning system; determine a difference between the first error information and the second error information; and create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

In an embodiment, when executed, the machine-readable instructions further cause the processor system to cause obtaining of the first measurement result of a first pattern provided by, and/or the first simulation result for a first pattern to be provided by, the first patterning device in the first patterning system and obtaining of the second measurement result of a second pattern provided by, and/or the second simulation result for a second pattern to be provided by, the second patterning device in the second patterning system. In an embodiment, the first error information is derived based on measurement of physical structures produced using the first patterning device in the first patterning system and/or based on simulation of physical structures to be produced using the first patterning device in the first patterning system. In an embodiment, the first error information comprises first patterning device registration error and/or first overlay error. In an embodiment, the second error information is derived based on measurement of physical structures produced using the second patterning device in the second patterning system and/or based on simulation of physical structures to be produced using the second patterning device in the second patterning system. In an embodiment, the second error information comprises second patterning device registration error and/or second overlay error. In an embodiment, the first pattern and the second pattern are produced in the same layer of a substrate. In an embodiment, the first pattern is produced on a different substrate than the second pattern. In an embodiment, the first pattern and the second pattern are produced in different layers of a substrate. In an embodiment, the first patterning device and the second patterning device are different copies of the same patterning device. In an embodiment, the first patterning device and the second patterning device are different patterning devices.

In an embodiment, there is provided a method comprising: modelling, by a computer system, a high resolution patterning error information of a patterning process involving a patterning device in a patterning system using an error mathematical model; modelling, by the computer system, a correction of the patterning error that can be made by a patterning device modification tool using a correction mathematical model, the correction mathematical model having substantially the same resolution as the error mathematical model; and determining, by the computer system, modification information for modifying the patterning device using the patterning device modification tool by applying the correction mathematical model to the patterning error information modeled by the error mathematical model.

In an embodiment, the method further comprises modelling a correction of the patterning error that can be made by one or more modification apparatuses of the patterning system using a further correction mathematical model, wherein the further correction mathematical model has a lower resolution than the correction mathematical model. In an embodiment, high resolution patterning error comprises one or more selected from: errors due to an etch-loading effect, errors due to projection system heating, errors due to patterning device heating, errors due to substrate heating, errors arising from illumination aberration sensitivity, errors in patterning system to patterning system matching, and/or errors in patterning device to patterning device matching. In an embodiment, the method further comprises selecting a sample scheme to measure patterning error information using a sample of a plurality of metrology targets on one or more substrates, the selecting based on the error mathematical model and one or more constraints. In an embodiment, high resolution comprises spatial frequencies on a substrate of 1 mm or less. In an embodiment, the patterning error information comprises overlay error, dose, focus and/or critical dimension.

In an embodiment, there is provided a system comprising: a hardware processor system; and a non-transitory computer readable storage medium storing machine-readable instructions, wherein when executed, the machine-readable instructions cause the processor system to: model, by a computer system, a high resolution patterning error information of a patterning process involving a patterning device in a patterning system using an error mathematical model; model, by the computer system, a correction of the patterning error that can be made by a patterning device modification tool using a correction mathematical model, the correction mathematical model having substantially the same resolution as the error mathematical model; and determine, by the computer system, modification information for modifying the patterning device using the patterning device modification tool by applying the correction mathematical model to the patterning error information modeled by the error mathematical model.

In an embodiment, when executed, the machine-readable instructions further cause the processor system to model a correction of the patterning error that can be made by one or more modification apparatuses of the patterning system using a further correction mathematical model, wherein the further correction mathematical model has a lower resolution than the correction mathematical model. In an embodiment, high resolution patterning error comprises one or more selected from: errors due to an etch-loading effect, errors due to projection system heating, errors due to patterning device heating, errors due to substrate heating, errors arising from illumination aberration sensitivity, errors in patterning system to patterning system matching, and/or errors in patterning device to patterning device matching. In an embodiment, when executed, the machine-readable instructions further cause the processor system to select a sample scheme to measure patterning error information using a sample of a plurality of metrology targets on one or more substrates, the selecting based on the error mathematical model and one or more constraints. In an embodiment, high resolution comprises spatial frequencies on a substrate of 1 mm or less. In an embodiment, the patterning error information comprises overlay error, dose, focus and/or critical dimension.

Figure 17:
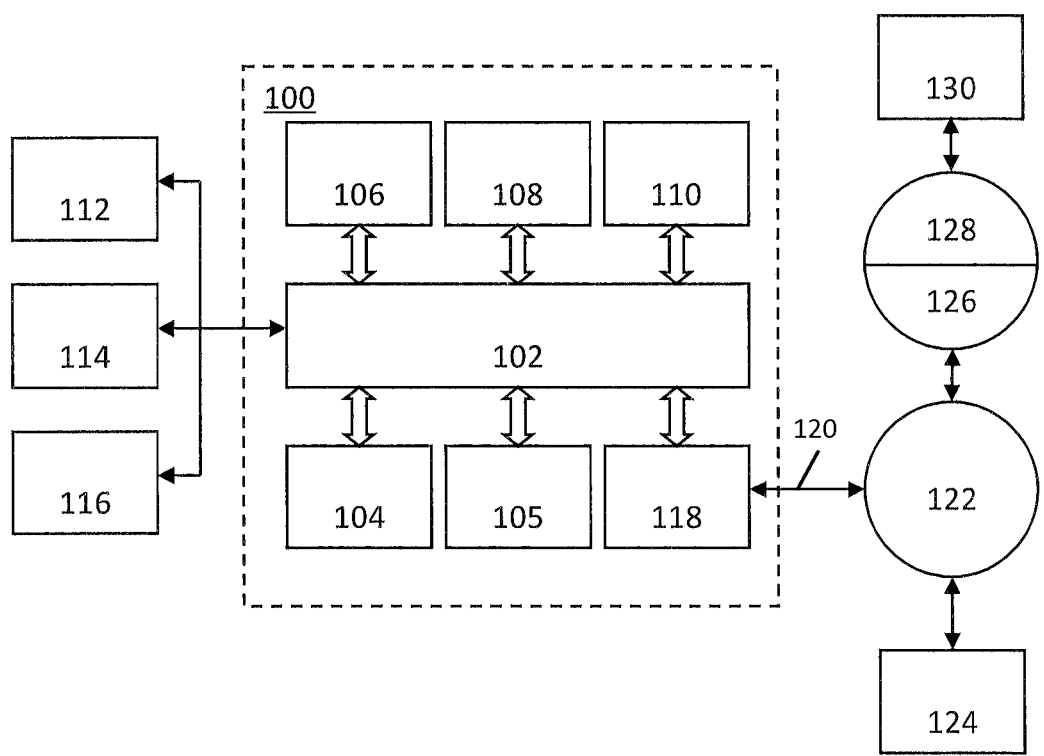
FIG. 17 schematically depicts a computer system which may implement embodiments of this disclosure.

Referring to FIG. 17, a computer system 100 is shown. The computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

The computer system 100 may be suitable to implement methods as described in FIGS. 5-7 and FIGS. 10-16 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

The invention may further be described using the following clauses:

1. A method comprising:
   determining first error information based on a first measurement and/or simulation result pertaining to a first patterning device in a patterning system;
   determining second error information based on a second measurement and/or simulation result pertaining to a second patterning device in the patterning system;
   determining a difference between the first error information and the second error information; and
   creating, by a computer system, modification information for the first patterning device and/or the second patterning device based on the difference between the first error information and the second error information, wherein the difference between the first error information and the second error information is reduced to within a certain range after the first patterning device and/or the second patterning device is modified according to the modification information.

2. A method comprising:
   determining first error information based on a first measurement and/or simulation result pertaining to a first patterning device in a patterning system;
   determining second error information based on a second measurement and/or simulation result pertaining to a second patterning device in the patterning system; and
   creating, by a computer system, modification information for the first patterning device and/or the second patterning device, wherein the modification information is configured to reduce a difference between the first error information and the second error information when the first patterning device and/or the second patterning device is modified according to the modification information.

3. The method of clause 1 or clause 2, further comprising obtaining the first measurement result of a first pattern provided by, and/or the first simulation result for a first pattern to be provided by, the first patterning device in the patterning system and obtaining the second measurement result of a second pattern provided by, and/or the second simulation result for a second pattern to be provided by, the second patterning device in the patterning system.

4. The method of any of clauses 1 to 3, wherein the first error information is derived based on measurement of physical structures produced using the patterning device in the patterning system and/or based on simulation of physical structures to be produced using the patterning device in the patterning system.

5. The method of any of clauses 1 to 4, wherein the first error information comprises first patterning device registration error and/or first overlay error.

6. The method of any of clauses 1 to 5, wherein the second error information is derived based on measurement of physical structures produced using the second patterning device in the patterning system and/or based on simulation of physical structures to be produced using the second patterning device in the patterning system.

7. The method of any of clauses 1 to 6, wherein the second error information comprises second patterning device registration error and/or second overlay error.

8. The method of any of clauses 1 to 7, wherein the first pattern and the second pattern are produced in the same layer of a substrate.

9. The method of any of clauses 1 to 7, wherein the first pattern is produced on a different substrate than the second pattern.

10. The method of any of clauses 1 to 7, wherein the first pattern and the second pattern are produced in different layers of a substrate.

11. The method of any of clauses 1 to 9, wherein the first patterning device and the second patterning device are different copies of the same patterning device.

12. The method of any of clauses 1 to 10, wherein the first patterning device and the second patterning device are different patterning devices.

13. A non-transitory computer program product comprising machine-readable instructions for causing a processor system to cause performance of the method of any of clauses 1 to 12.

14. A system comprising:
    a hardware processor system; and
    a non-transitory computer readable storage medium storing machine-readable instructions, wherein when executed, the machine-readable instructions cause the processor system to:
    determine first error information based on a first measurement and/or simulation result pertaining to a first patterning device in a patterning system;

determine second error information based on a second measurement and/or simulation result pertaining to a second patterning device in the patterning system;

determine a difference between the first error information and the second error information; and create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

15. A system comprising:

a hardware processor system; and a non-transitory computer readable storage medium storing machine-readable instructions, wherein when executed, the machine-readable instructions cause the processor system to:

determine first error information based on a first measurement and/or simulation result pertaining to a first patterning device in a patterning system;

determine second error information based on a second measurement and/or simulation result pertaining to a second patterning device in the patterning system; and create modification information for the first patterning device and/or the second patterning device, wherein the modification information is configured to reduce a difference between the first error information and the second error information when the first patterning device and/or the second patterning device is modified according to the modification information.

16. The system of clause 14 or clause 15, wherein when executed, the machine-readable instructions further cause the processor system to cause obtaining of the first measurement result of a first pattern provided by, and/or the first simulation result for a first pattern to be provided by, the first patterning device in the patterning system and obtaining of the second measurement result of a second pattern provided by, and/or the second simulation result for a second pattern to be provided by, the second patterning device in the patterning system.

17. The system of any of clauses 14 to 16, wherein the first error information is derived based on measurement of physical structures produced using the first patterning device in the patterning system and/or based on simulation of physical structures to be produced using the first patterning device in the patterning system.

18. The system of any of clauses 14 to 17, wherein the first error information comprises first patterning device registration error and/or first overlay error.

19. The system of any of clauses 14 to 18, wherein the second error information is derived based on measurement of physical structures produced using the second patterning device in the patterning system and/or based on simulation of physical structures to be produced using the second patterning device in the patterning system.

20. The system of any of clauses 14 to 19, wherein the second error information comprises second patterning device registration error and/or second overlay error.

21. The system of any of clauses 14 to 20, wherein the first pattern and the second pattern are produced in the same layer of a substrate.

22. The system of any of clauses 14 to 20, wherein the first pattern is produced on a different substrate than the second pattern.

23. The system of any of clauses 14 to 20, wherein the first pattern and the second pattern are produced in different layers of a substrate.

24. The system of any of clauses 14 to 22, wherein the first patterning device and the second patterning device are different copies of the same patterning device.

25. The system of any of clauses 14 to 23, wherein the first patterning device and the second patterning device are different patterning devices.

26. A method comprising:

determining first error information based on a first measurement and/or simulation result pertaining to a first patterning device in a first patterning system;

determining second error information based on a second measurement and/or simulation result pertaining to a second patterning device in a second patterning system;

determining a difference between the first error information and the second error information; and creating, by a computer system, modification information for the first patterning device and/or the second patterning device based on the difference between the first error information and the second error information, wherein the difference between the first error information and the second error information is reduced within a certain range after the first patterning device and/or the second patterning device is modified according to the modification information.

27. A method comprising:

determining first error information based on a first measurement and/or simulation result pertaining to a first patterning device in a first patterning system;

determining second error information based on a second measurement and/or simulation result pertaining to a second patterning device in a second patterning system; and creating, by a computer system, modification information for the first patterning device and/or the second patterning device, wherein the modification information is configured to reduce a difference between the first error information and the second error information when the first patterning device and/or the second patterning device is modified according to the modification information.

28 The method of clause 26 or clause 27, further comprising obtaining the first measurement result of a first pattern provided by, and/or the first simulation result for a first pattern to be provided by, the first patterning device in the first patterning system and obtaining the second measurement result of a second pattern provided by, and/or the second simulation result for a second pattern to be provided by, the second patterning device in the second patterning system.

29. The method of any of clauses 26 to 28, wherein the first error information is derived based on measurement of physical structures produced using the first patterning device in the first patterning system and/or based on simulation of physical structures to be produced using the first patterning device in the first patterning system.

30. The method of any of clauses 26 to 29, wherein the first error information comprises first patterning device registration error and/or first overlay error.

31. The method of any of clauses 26 to 30, wherein the second error information is derived based on measurement of physical structures produced using the second patterning device in the second patterning system and/or based on simulation of physical structures to be produced using the second patterning device in the second patterning system.

32. The method of any of clauses 26 to 31, wherein the second error information comprises second patterning device registration error and/or second overlay error.

33. The method of any of clauses 26 to 32, wherein the first pattern and the second pattern are produced in the same layer of a substrate.

34. The method of any of clauses 26 to 32, wherein the first pattern is produced on a different substrate than the second pattern.

35. The method of any of clauses 26 to 32, wherein the first pattern and the second pattern are produced in different layers of a substrate.

36. The method of any of clauses 26 to 34, wherein the first patterning device and the second patterning device are different copies of the same patterning device.

37. The method of any of clauses 26 to 35, wherein the first patterning device and the second patterning device are different patterning devices.

38. A non-transitory computer program product comprising machine-readable instructions for causing a processor system to cause performance of the method of any of clauses 26 to 37.

39. A system comprising:
   a hardware processor system; and
   a non-transitory computer readable storage medium storing machine-readable instructions, wherein when executed, the machine-readable instructions cause the processor system to:
   determine first error information based on a first measurement and/or simulation result pertaining to a first patterning device in a first patterning system;
   determine second error information based on a second measurement and/or simulation result pertaining to a second patterning device in a second patterning system;
   determine a difference between the first error information and the second error information; and
   create modification information for the first patterning device and/or the second patterning device based on the difference between the first error information and the second error information, wherein the difference between the first error information and the second error information is reduced to within a predetermined range after the first patterning device and/or the second patterning device are modified according to the modification information.

40. A system comprising:
   a hardware processor system; and
   a non-transitory computer readable storage medium storing machine-readable instructions, wherein when executed, the machine-readable instructions cause the processor system to:
   determine first error information based on a first measurement and/or simulation result pertaining to a first patterning device in a first patterning system;
   determine second error information based on a second measurement and/or simulation result pertaining to a second patterning device in a second patterning system; and
   create modification information for the first patterning device and/or the second patterning device, wherein the modification information is configured to reduce a difference between the first error information and the second error information when the first patterning device and/or the second patterning device is modified according to the modification information.

41. The system of clause 39 or clause 40, wherein when executed, the machine-readable instructions further cause the processor system to cause obtaining of the first measurement result of a first pattern provided by, and/or the first simulation result for a first pattern to be provided by, the first patterning device in the first patterning system and obtaining of the second measurement result of a second pattern provided by, and/or the second simulation result for a second pattern to be provided by, the second patterning device in the second patterning system.

42. The system of any of clauses 39 to 41, wherein the first error information is derived based on measurement of physical structures produced using the first patterning device in the first patterning system and/or based on simulation of physical structures to be produced using the first patterning device in the first patterning system.

43. The system of any of clauses 39 to 38, wherein the first error information comprises first patterning device registration error and/or first overlay error.

44. The system of any of clauses 39 to 43, wherein the second error information is derived based on measurement of physical structures produced using the second patterning device in the second patterning system and/or based on simulation of physical structures to be produced using the second patterning device in the second patterning system.

45. The system of any of clauses 39 to 44, wherein the second error information comprises second patterning device registration error and/or second overlay error.

46. The system of any of clauses 39 to 45, wherein the first pattern and the second pattern are produced in the same layer of a substrate.

47. The system of any of clauses 39 to 45, wherein the first pattern is produced on a different substrate than the second pattern.

48. The system of any of clauses 39 to 45, wherein the first pattern and the second pattern are produced in different layers of a substrate.

49. The system of any of clauses 39 to 47, wherein the first patterning device and the second patterning device are different copies of the same patterning device.

50. The system of any of clauses 39 to 48, wherein the first patterning device and the second patterning device are different patterning devices.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the disclosure as described without departing from the scope of the claims set out below.

What is claimed is:

1. A method comprising:
   determining first error information based on a first simulation result pertaining to a first pattern to be provided by a first patterning device in a patterning system;
   determining second error information based on a second measurement and/or simulation result pertaining to a second patterning device;
   determining a difference between the first error information and the second error information; and
   creating, by a hardware computer system, modification information for the first patterning device and/or the second patterning device based on the difference between the first error information and the second error information, wherein the difference between the first error information and the second error information is reduced to within a certain range after the first patterning device and/or the second patterning device is modified according to the modification information.

2. The method of claim 1, further comprising obtaining a first measurement result of the first pattern provided by, and/or the first simulation result for the first pattern to be provided by, the first patterning device in a patterning system and obtaining the second measurement result of a second pattern provided by, and/or the second simulation result for a second pattern to be provided by, the second patterning device in a patterning system.

3. The method of claim 1, wherein the first error information is derived based on measurement of physical structures produced using the patterning device in a patterning system and/or based on simulation of physical structures to be produced using the patterning device in a patterning system.

4. The method of claim 1, wherein the first error information comprises first patterning device registration error and/or first overlay error.

5. The method of claim 1, wherein the first pattern and the second pattern are produced in a same layer of a substrate, or wherein the first pattern is produced on a different substrate than the second pattern, or wherein the first pattern and the second pattern are produced in different layers of a substrate.

6. The method of claim 1, wherein the first patterning device and the second patterning device are different copies of the same patterning device, or wherein the first patterning device and the second patterning device are different patterning devices.

7. A non-transitory computer program product comprising machine-readable instructions therein, the instructions, when executed by a processor system configured to cause the processor system to at least:
   determine first error information based on a first simulation result pertaining to a first pattern to be provided by a first patterning device in a patterning system;
   determine second error information based on a second measurement and/or simulation result pertaining to a second patterning device;
   determine a difference between the first error information and the second error information; and
   create modification information for the first patterning device and/or the second patterning device based on the difference between the first error information and the second error information, wherein the difference between the first error information and the second error information is reduced to within a certain range after the first patterning device and/or the second patterning device is modified according to the modification information.

8. The method of claim 1, wherein the first patterning device is in, or for, a first patterning system and the second patterning device is in, or for, a second patterning system.

9. The method of claim 1, further comprising using the modification information to physically modify the first patterning device and/or the second patterning device using a radiation beam.

10. A method comprising:
    determining first error information based on a first measurement and/or simulation result pertaining to a first patterning device;
    determining second error information based on a second measurement and/or simulation result pertaining to a second patterning device; and
    creating, by a hardware computer system, modification information for the first patterning device and/or the second patterning device and for a modification apparatus of a patterning system in which a pattern is to be created using the first patterning device and/or the second patterning device, wherein the modification information is configured to reduce a difference between the first error information and the second error information when the first patterning device and/or the second patterning device is modified and the modification apparatus modifies operation of the patterning system, according to the modification information.

11. The method of claim 10, wherein the first patterning device is in, or for, a first patterning system and the second patterning device is in, or for, a second patterning system.

12. The method of claim 10, further comprising obtaining the first measurement result of a first pattern provided by, and/or the first simulation result for a first pattern to be provided by, the first patterning device in a patterning system and obtaining the second measurement result of a second pattern provided by, and/or the second simulation result for a second pattern to be provided by, the second patterning device in a patterning system.

13. The method of claim 10, wherein the first error information is derived based on measurement of physical structures produced using the patterning device in a patterning system and/or based on simulation of physical structures to be produced using the patterning device in a patterning system.

14. The method of claim 10, wherein the first error information comprises first patterning device registration error and/or first overlay error.

15. The method of claim 10, wherein the first pattern and the second pattern are produced in a same layer of a substrate, or wherein the first pattern is produced on a different substrate than the second pattern, or wherein the first pattern and the second pattern are produced in different layers of a substrate.

16. The method of claim 10, wherein the first patterning device and the second patterning device are different copies of the same patterning device, or wherein the first patterning device and the second patterning device are different patterning devices.

17. The method of claim 10, further comprising using the modification information to physically modify the first patterning device and/or the second patterning device using a radiation beam.

18. A system comprising:
    a hardware processor system; and
    the non-transitory computer readable storage medium of claim 7.

19. A non-transitory computer program product comprising machine-readable instructions therein, the instructions, when executed by a processor system configured to cause the processor system to at least:
    determine first error information based on a first measurement and/or simulation result pertaining to a first patterning device;
    determine second error information based on a second measurement and/or simulation result pertaining to a second patterning device; and
    create modification information for the first patterning device and/or the second patterning device and for a modification apparatus of a patterning system in which a pattern is to be created using the first patterning device and/or the second patterning device, wherein the modification information is configured to reduce a difference between the first error information and the second error information when the first patterning device and/or the second patterning device is modified and the modification apparatus modifies operation of the patterning system, according to the modification information.

20. A system comprising:
a hardware processor system; and
the non-transitory computer readable storage medium of claim 19.

* * * * *